United States Patent
Liu et al.

(10) Patent No.: US 10,304,512 B2
(45) Date of Patent: May 28, 2019

(54) FERROELECTRIC MEMORY, DATA READING/WRITING METHOD AND MANUFACTURING METHOD THEREOF AND CAPACITOR STRUCTURE

(71) Applicant: NuStorage Technology Co., Ltd., Apia (WS)

(72) Inventors: Fu-Chou Liu, Hsin-Chu County (TW); Yung-Tin Chen, Taoyuan (TW)

(73) Assignee: NUSTORAGE TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 15/942,599

(22) Filed: Apr. 2, 2018

(65) Prior Publication Data

US 2018/0366174 A1 Dec. 20, 2018

(30) Foreign Application Priority Data

Jun. 14, 2017 (CN) .......................... 2017 1 0449284

(51) Int. Cl.

| G11C 11/22 | (2006.01) |
| H01G 4/08 | (2006.01) |
| H01L 27/108 | (2006.01) |
| H01G 4/01 | (2006.01) |
| H01L 27/11504 | (2017.01) |
| H01L 27/11507 | (2017.01) |

(52) U.S. Cl.
CPC ........ G11C 11/221 (2013.01); G11C 11/2257 (2013.01); G11C 11/2259 (2013.01); G11C 11/2273 (2013.01); G11C 11/2275 (2013.01); H01G 4/01 (2013.01); H01G 4/08 (2013.01); H01L 27/10852 (2013.01); H01L 27/11504 (2013.01); H01L 27/11507 (2013.01)

(58) Field of Classification Search
CPC ............. G11C 11/221; H01L 27/11507; H01L 27/11504
See application file for complete search history.

(56) References Cited

U.S. PATENT DOCUMENTS

| 6,046,929 A * | 4/2000 | Aoki ....................... G11C 11/22 257/E21.664 |
| 6,067,244 A | 5/2000 | Ma et al. |
| 6,094,370 A * | 7/2000 | Takashima .............. G11C 11/22 257/E27.104 |

(Continued)

*Primary Examiner* — Mushfique Siddique
(74) *Attorney, Agent, or Firm* — WPAT, PC

(57) ABSTRACT

A selected ferroelectric memory cell of a ferroelectric memory is electrically connected to a first bit line, a second bit line, a first word line, a second word line and a plate line. The selected ferroelectric memory cell includes a first field effect transistor ("FET"), a second FET and a ferroelectric capacitor. A control terminal and a first access terminal of the first FET are electrically connected to the first word line and the first bit line, respectively. A control terminal and a first access terminal of the second FET are electrically connected to the second word line and the second bit line, respectively. A second access terminal of the first FET is electrically connected to a first capacitor electrode of the ferroelectric capacitor and a second terminal of the second FET. A second capacitor electrode of the ferroelectric capacitor is electrically connected to the plate line.

8 Claims, 22 Drawing Sheets

(56) References Cited

U.S. PATENT DOCUMENTS

| | | | | |
|---|---|---|---|---|
| 6,118,687 A | * | 9/2000 | Kang | G11C 11/22 |
| | | | | 257/E21.68 |
| 6,198,652 B1 | * | 3/2001 | Kawakubo | G11C 11/22 |
| | | | | 257/295 |
| 6,320,782 B1 | * | 11/2001 | Takashima | G11C 11/22 |
| | | | | 257/E27.104 |
| 6,353,550 B1 | * | 3/2002 | Hirano | G11C 11/22 |
| | | | | 365/145 |
| 6,356,475 B1 | * | 3/2002 | Tamura | G11C 11/22 |
| | | | | 365/145 |
| 6,411,540 B1 | * | 6/2002 | Ashikaga | G11C 11/22 |
| | | | | 365/145 |
| 7,161,202 B2 | * | 1/2007 | Hoya | H01L 27/11502 |
| | | | | 257/295 |
| 2001/0053087 A1 | * | 12/2001 | Kato | G11C 11/22 |
| | | | | 365/149 |
| 2003/0076704 A1 | * | 4/2003 | Ashikaga | G11C 11/22 |
| | | | | 365/145 |
| 2003/0235067 A1 | * | 12/2003 | Sakai | G11C 11/22 |
| | | | | 365/145 |
| 2005/0135143 A1 | * | 6/2005 | Jeon | G11C 11/22 |
| | | | | 365/145 |
| 2006/0083049 A1 | * | 4/2006 | Chandler | G11C 11/22 |
| | | | | 365/145 |
| 2018/0226116 A1 | * | 8/2018 | Derner | G11C 11/2275 |
| 2018/0366174 A1 | * | 12/2018 | Liu | G11C 11/2259 |
| 2018/0366476 A1 | * | 12/2018 | Liu | H01L 27/1159 |

* cited by examiner

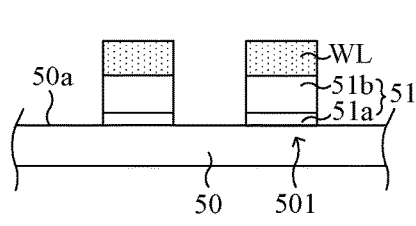 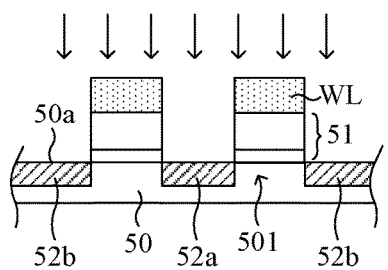
FIG. 9A  FIG. 9B
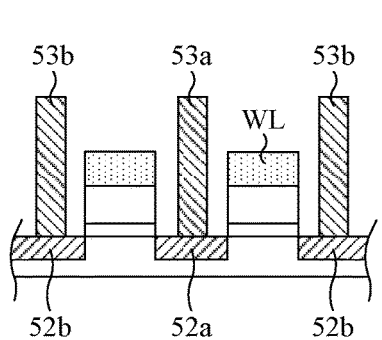 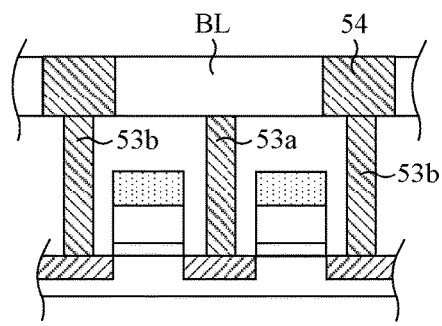
FIG. 9C  FIG. 9D

FERROELECTRIC MEMORY, DATA READING/WRITING METHOD AND MANUFACTURING METHOD THEREOF AND CAPACITOR STRUCTURE

TECHNICAL FIELD

The present disclosure relates to the field of a ferroelectric memory, and particularly to a structure, a data reading method, a data writing method, a manufacturing method and a capacitor of the ferroelectric memory.

BACKGROUND

With development of ferroelectric materials, the idea of applying a ferroelectric field effect transistor (FeFET) to a dynamic random-access memory has been proposed in some references, e.g. in U.S. Pat. No. 6,067,244. However, there are many drawbacks in the techniques addressed by the references. One of the drawbacks is that it is difficult to synthesize a ferroelectric material and a Si substrate. Furthermore, some ferroelectric materials also require thicker ferroelectric layers (e.g. larger than 200 nm) for enabling desired characteristics. Therefore, it is very hard for current techniques to scale down FeFETs, fabrication processes of the FeFETs are also difficult, and cost of the FeFETs is high. Although ferroelectric materials doped with hafnium dioxide ($HfO_2$) is proposed to scale down the FeFETs in recent references, the $HfO_2$ concentration is extremely low (about 3-5%), and it is difficult to control the doping uniformity across a wafer.

Moreover, many problems still exist in application of FeFETs. For example, the data stored in a FeFET may be easily affected when the FeFET is biased with one half of a programming voltage Vpp (the programming voltage Vpp represents the voltage required for programming a memory cell). One current solution is proposed as follows. During program operation (e.g. write "1"), unselected memory cells connected to the selected word line (WL) or the selected bit line (BL) are biased to ⅔ Vpp, and other unselected word lines are biased to ⅓ Vpp. During erase operation (e.g. write "0"), unselected memory cells connected to the selected word line or the selected bit line are biased with ⅓ Vpp, and other unselected word lines are biased to ⅔ Vpp. This method can reduce possibility of affecting the data stored in the memory cells.

Therefore, in summary, drawbacks still exist in the current techniques. To the area of ferroelectric technology, a new ferroelectric memory structure and the operation method thereof become objects which all parties are actively studying.

SUMMARY

An aspect of the present disclosure provides a data reading method of a ferroelectric memory, suitable for accessing data stored in the ferroelectric memory The ferroelectric memory includes at least one ferroelectric memory cell, wherein the ferroelectric memory cell includes a first field effect transistor (FET) and a ferroelectric capacitor. The first FET includes a control terminal, a first access terminal and a second access terminal, and the ferroelectric capacitor includes a first capacitor electrode and a second capacitor electrode. The control terminal, the first access terminal and the second access terminal of the first FET are respectively electrically connected to a first word line, a first bit line and the first capacitor electrode of the ferroelectric capacitor, and the second capacitor electrode of the ferroelectric capacitor is electrically connected to a plate line. The data reading method includes the following steps. A first signal is provided to the plate line wherein a voltage level of the first signal during a first time period is different from the voltage level of the first signal outside the first time period. A second signal is provided to the first word line wherein a voltage level of the second signal during a second time period is different from the voltage level of the second signal outside the second time period. A first data signal is obtained from the first bit line during the second time period. Corresponding data is written into the ferroelectric memory cell during the first time period according to a relation between a voltage level of the first data signal and a reference level. Data stored in the ferroelectric memory cell is output according to the relation between the voltage level of the first data signal and the reference level. The first time period entirely covers the second time period, and the voltage level of the first signal is constant during the first time period.

Another aspect of the present disclosure provides a data writing method of a ferroelectric memory, suitable for accessing data stored in the ferroelectric memory. The ferroelectric memory includes at least one ferroelectric memory cell, wherein the ferroelectric memory cell includes a first FET and a ferroelectric capacitor. The first FET includes a control terminal, a first access terminal and a second access terminal, and the ferroelectric capacitor includes a first capacitor electrode and a second capacitor electrode. The control terminal, the first access terminal and the second access terminal of the first FET are respectively electrically connected to a word line, a first bit line and the first capacitor electrode of the ferroelectric capacitor, and the second capacitor electrode of the ferroelectric capacitor is electrically connected to a plate line. The data writing method includes the following steps. A first signal is provided to the plate line wherein a voltage level of the first signal during a first time period is different from the voltage level of the first signal outside the first time period. A second signal is provided to the word line wherein a voltage level of the second signal during a second time period is different from the voltage level of the second signal outside the second time period. A write signal is provided to the first bit line during the second time period. The write signal corresponds to the data which is to be written into the ferroelectric memory cell. The first time period entirely covers the second time period, and the voltage level of the first signal is constant during the first time period.

Another aspect of the present disclosure provides a ferroelectric memory including a plurality of ferroelectric memory cells. A selected ferroelectric memory cell is electrically connected to a first bit line, a second bit line, a first word line, a second word line and a plate line. The selected ferroelectric memory cell includes a first FET, a second FET and a ferroelectric capacitor. Each of the first FET and the second FET includes a control terminal, a first access terminal and a second access terminal. The ferroelectric capacitor includes a first capacitor electrode and a second capacitor electrode. The control terminal and the first access terminal of the first FET are respectively electrically connected to the first word line and the first bit line, the second access terminal of the first FET is electrically connected to the first capacitor electrode of the ferroelectric capacitor and the second access terminal of the second FET, the second capacitor electrode of the ferroelectric capacitor is electrically connected to a plate line, the control terminal and the first access terminal of the second FET are respectively electrically connected to the second word line and the second bit line.

Another aspect of the present disclosure provides a manufacturing method of a ferroelectric memory including at least one ferroelectric memory cell. The ferroelectric memory cell includes a first FET and a ferroelectric capacitor. The manufacturing method includes the following steps. A semiconductor substrate made of a semiconductor material is provided. A first dielectric layer and a first word line are piled up and formed over a first area of the semiconductor substrate. A doping step is performed to dope a conductive material into the semiconductor substrate by using the first word line as a mask to form a first doped region and a second doped region, both of which are adjacent to the first area. The first FET includes the first dielectric layer, the first word line, the first doped region, the second doped region and the first area of the semiconductor substrate. A first interconnect and a second interconnect are formed over the first doped region and the second doped region, respectively. A first bit line is formed on and electrically connected to the first interconnect. The ferroelectric capacitor is formed and it includes a first capacitor electrode, a second capacitor electrode and a second dielectric layer separating the first capacitor electrode from the second capacitor electrode. The first capacitor electrode is electrically connected to the second interconnect. A plate line is formed on and electrically connected to the second capacitor electrode.

Another aspect of the present disclosure provides a capacitor structure. The capacitor structure includes a first capacitor electrode, a dielectric layer and a second capacitor electrode. The second capacitor electrode includes a pillar structure. The dielectric layer covers a lateral surface and a bottom surface of the second capacitor electrode. A top surface of the second capacitor electrode is exposed from an upper opening of the dielectric layer. The dielectric layer further includes a flange neighboring with the upper opening and extending along a direction away from the second capacitor electrode. The first capacitor electrode covers a lateral surface and a bottom surface of the dielectric layer. The flange of the dielectric layer covers a top surface of the first capacitor electrode.

BRIEF DESCRIPTION OF THE DRAWINGS

The advantages of the present disclosure will become more readily apparent to those ordinarily skilled in the art after reviewing the following detailed description and accompanying drawings, in which:

FIG. 9A~FIG. 9E are schematic diagrams illustrating a manufacturing method of the ferroelectric memory according an embodiment of the present disclosure;

DETAILED DESCRIPTION OF PREFERRED EMBODIMENTS

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
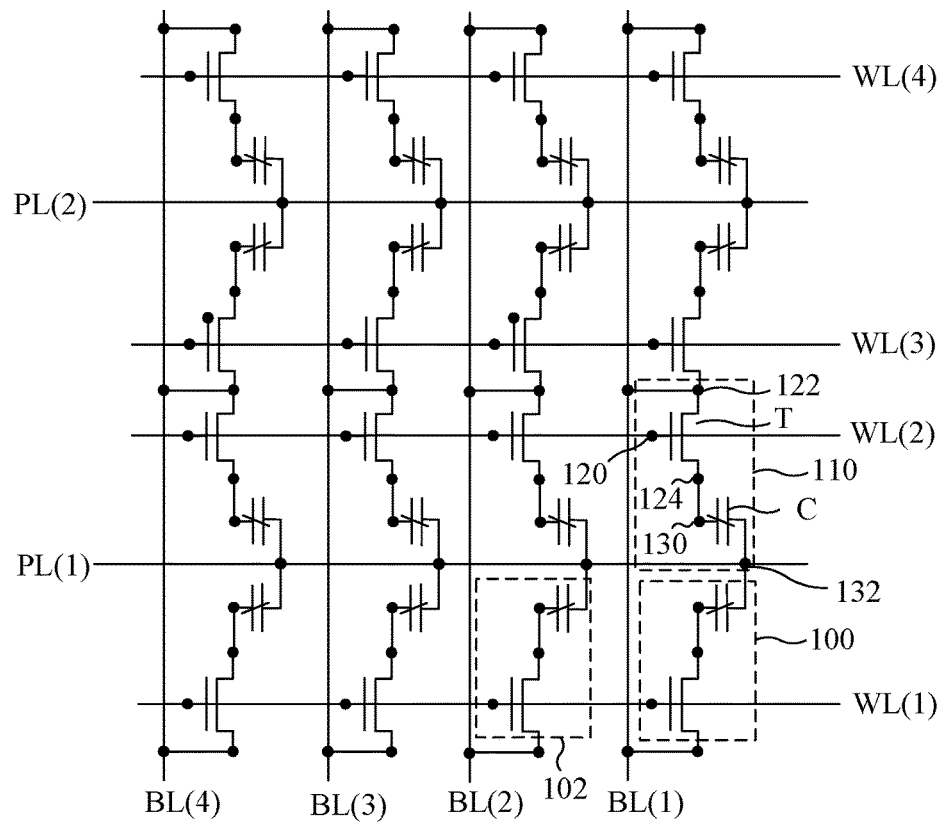
FIG. 1 is a circuit diagram illustrating a portion of a ferroelectric memory according to an embodiment of the present disclosure.

Please refer to FIG. 1, a circuit diagram illustrating a portion of a ferroelectric memory according to an embodiment of the present disclosure. The ferroelectric memory 10 includes a plurality of ferroelectric memory cells (e.g. 100, 102, 110), each of which includes a field effect transistor (FET) and a ferroelectric capacitor. Each ferroelectric memory cell is electrically connected to one of the bit lines (e.g. BL(1)~BL(4)), one of the word lines (e.g. WL(1)~WL(4)) and one of the plate lines (e.g. PL(1)~PL(2)). Taking the ferroelectric memory cell 110 as an example, it includes an FET T and a ferroelectric capacitor C. The control terminal 120 of the FET T is electrically connected to the word line WL(2), one access terminal 122 of the FET T is electrically connected to the bit line BL(1), and the other access terminal 124 of the FET T is electrically connected to one capacitor electrode 130 of the ferroelectric capacitor C. The other capacitor electrode 132 is electrically connected to the plate line PL(1). Each ferroelectric memory cell in the array has a circuit structure similar to that of the ferroelectric memory cell 110, the only difference between any two of the ferroelectric memory cells is that the bit lines, the word lines and the plate lines electrically connected to the corresponding ferroelectric memory cells are different, and thus we shall not repeat detail description of each ferroelectric memory cell again.

In another embodiment, two adjacent ferroelectric memory cells 100 in FIG. 1 are considered as one ferroelectric memory cell for data reading/writing operation. Please refer to FIG. 2, a circuit diagram illustrating a portion of a ferroelectric memory according to another embodiment of the present disclosure. The circuit of the ferroelectric memory 20 is identical to that of the ferroelectric memory 10. However, in operation, each ferroelectric memory cell 200 includes a pair of ferroelectric memory cells 100 (e.g. left part 100L and right part 100R) as shown in FIG. 1. The specific circuit connection is the same as that shown in FIG. 1 and will not be described again here.

Figure 3:
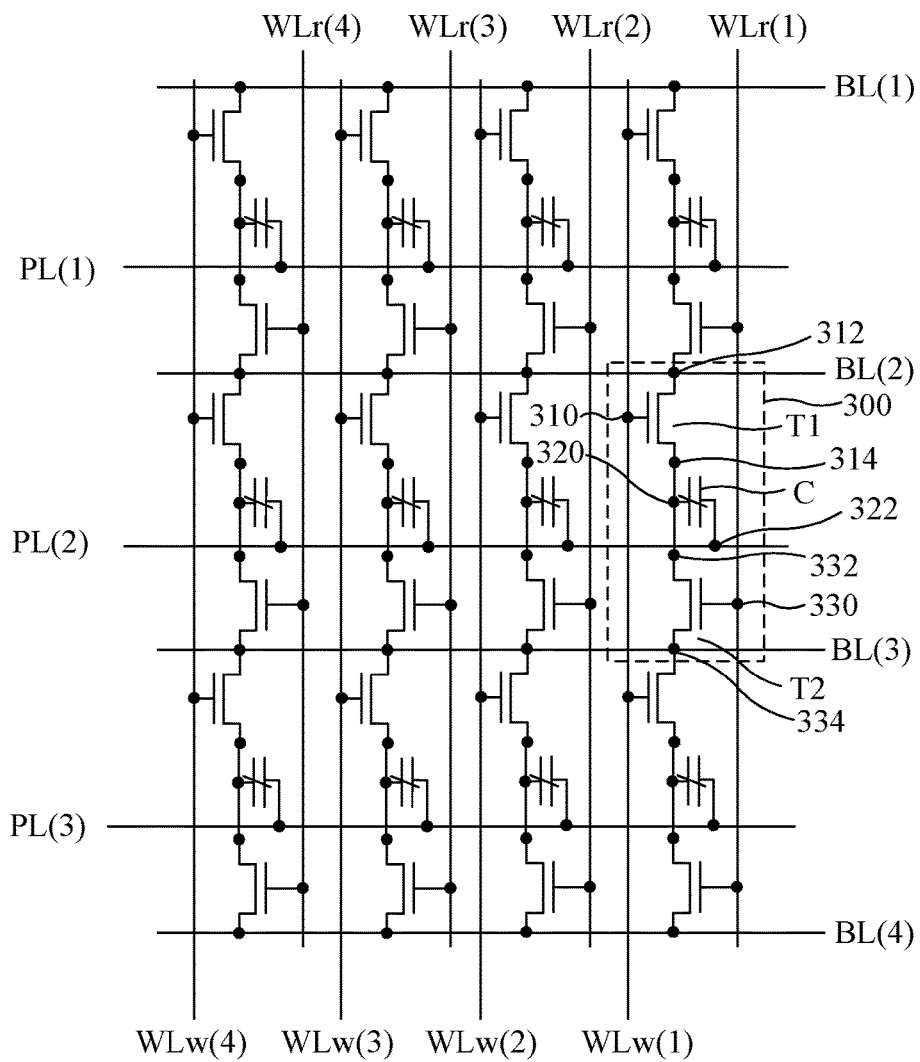
FIG. 3 is a circuit diagram illustrating a portion of a ferroelectric memory according to a further embodiment of the present disclosure.

Please refer to FIG. 3, a circuit diagram illustrating a portion of a ferroelectric memory according to a further embodiment of the present disclosure. In the embodiment, the ferroelectric memory 30 includes a plurality of ferroelectric memory cells 300. One ferroelectric memory cell 300 marked in the figure is taken as an example and includes two FETs T1, T2 and one ferroelectric capacitor C. The control terminal 310 of the FET T1 is electrically connected to the word line WLw(1), one access terminal 312 of the FET T1 is electrically connected to the bit line BL(2), and the other access terminal 314 of the FET T1 is electrically connected to one capacitor electrode 320 of the ferroelectric capacitor C. The other capacitor electrode 322 of the ferroelectric capacitor C is electrically connected to the plate line PL(2). The control terminal 330 of the FET T2 is electrically connected to the word line WLr(1), one access terminal 332 of the FET T2 is electrically connected to the capacitor electrode 320, and the other access terminal 334 of the FET T2 is electrically connected to the bit line BL(3). Generally speaking, each ferroelectric memory cell in this embodiment includes two FETs and one ferroelectric capacitor, and the FETs are electrically connected to distinct word lines, distinct bit lines and one corresponding plate line.

Data writing methods and data reading methods of the ferroelectric memories in the above embodiments are described in the following paragraphs.

Figure 4:
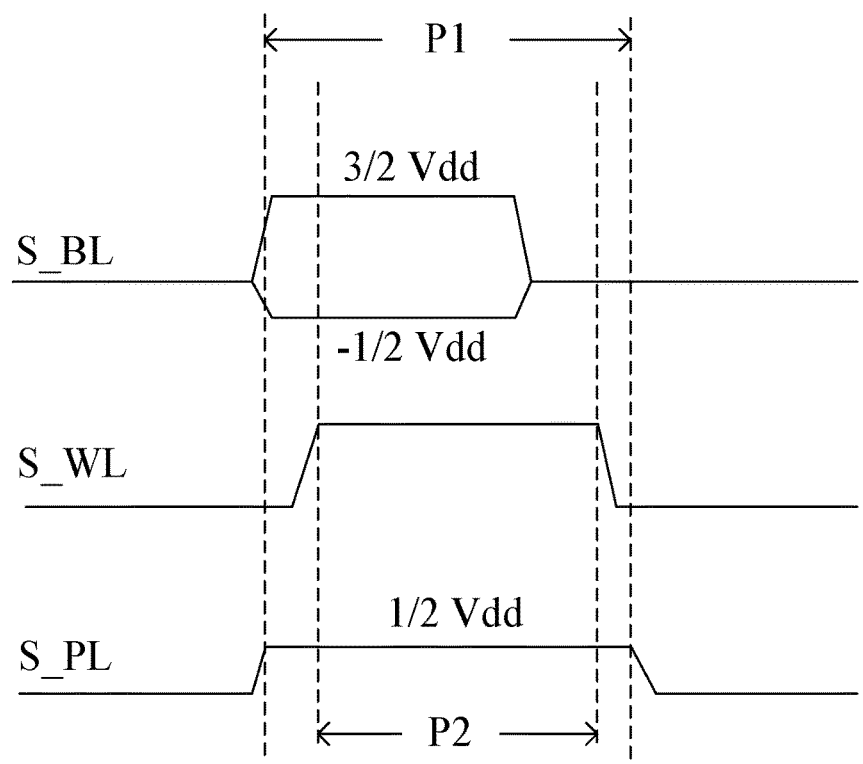
FIG. 4 is a timing diagram of a data writing method of the ferroelectric memory of FIG. 1 according to an embodiment of the present disclosure.

Please refer to both FIG. 1 and FIG. 4, wherein FIG. 4 is a timing diagram of a data writing method of the ferroelectric memory of FIG. 1 according to an embodiment of the present disclosure. Taking the ferroelectric memory cell 110 in FIG. 1 as an example again, while writing the data into the ferroelectric memory cell 110, the signal S_PL is provided to the plate line PL(1), the signal S_WL is provided to the word line WL(2), and the write signal S_BL corresponding to the data to be written and stored into the ferroelectric memory cell 110 is provided to the bit line BL(1). The voltage level of the signal S_PL provided to the plate line PL(1) during the first time period P1 is different from that outside the first time period P1. The voltage level of the signal S_WL during the second time period P2 is different from that outside the second time period P2. The first time period P1 entirely covers the second time period P2. In other words, the whole second time period P2 is inside the first time period P1. The voltage level of the signal S_PL is constant during the first time period P1.

In this embodiment, the write signal S_BL corresponding to the data to be written and stored into the ferroelectric memory cell 110 may have several possible voltage levels. If the data to be written into the ferroelectric memory cell 110 is logic "1", the write signal S_BL is set to have a specified data write level, e.g. $(3/2)*Vdd$ (Vdd is the potential difference between two capacitor electrodes of the capacitor C, required for programming the ferroelectric capacitor C to another storage state). On the contrary, If the data to be written into the ferroelectric memory cell 110 is logic "0", the write signal S_BL is set to have another specified data write level, e.g. $-(1/2)*Vdd$. Furthermore, after the specified data write level is applied and before the end of the second time period P2, the voltage level of the bit line BL(1) may be adjusted to a default voltage level (e.g. GND) falling between the two specified data write levels (e.g. $(3/2)*Vdd$ and $-(1/2)*Vdd$) so as to retain the polarization of the ferroelectric capacitor C.

Concretely, to start the data writing operation, at the beginning of the first time period P1, the voltage level of the plate line PL(1) is adjusted to $(1/2)*Vdd$, and the voltage level of the bit line BL(1) is adjusted to one of the above-mentioned specified data write levels according to the data to be written into the ferroelectric memory cell 110. Then, after the second time period P2 starts, the voltage level of the word line WL(2) is adjusted to be sufficient to switch on the FET T. Hence, the voltage level of the bit line BL(1) is transferred to the capacitor electrode 130 through the FET T. The potential difference between the capacitor electrodes 130 and 132 (i.e. the voltage level of the plate line PL(1)) affects the electric potential stored by the ferroelectric capacitor C. Moreover, the voltage level of the plate line PL(1) is kept constant. Thus, the electric potential supplied to the bit line BL(1) determines the electric potential stored in the ferroelectric capacitor C (equal to the data content stored in the ferroelectric capacitor C).

In this embodiment, after a period of time for writing data into the ferroelectric capacitor C, the voltage level of the bit line BL(1) is adjusted to the default voltage level. It is to be noted that the voltage difference between the default voltage level and the voltage level of the plate line PL(1)) should not be sufficient for changing the programmed state of the ferroelectric capacitor C, so that the data stored in the ferroelectric capacitor C will not be affected. Subsequently, once the second time period P2 ends, the signal S_WL provided to the word line WL(2) is adjusted to switch off the FET T. Lastly, after the first time period P1 ends, the voltage level of the signal S_PL provided to the plate line PL(1) is adjusted to be close to the voltage level of the bit line BL(1) (e.g. GND) to prevent from disturbing the data stored in the ferroelectric capacitor C.

After the above steps, the data is successfully and properly written into the ferroelectric capacitor C of the ferroelectric memory cell 110.

Figure 5:
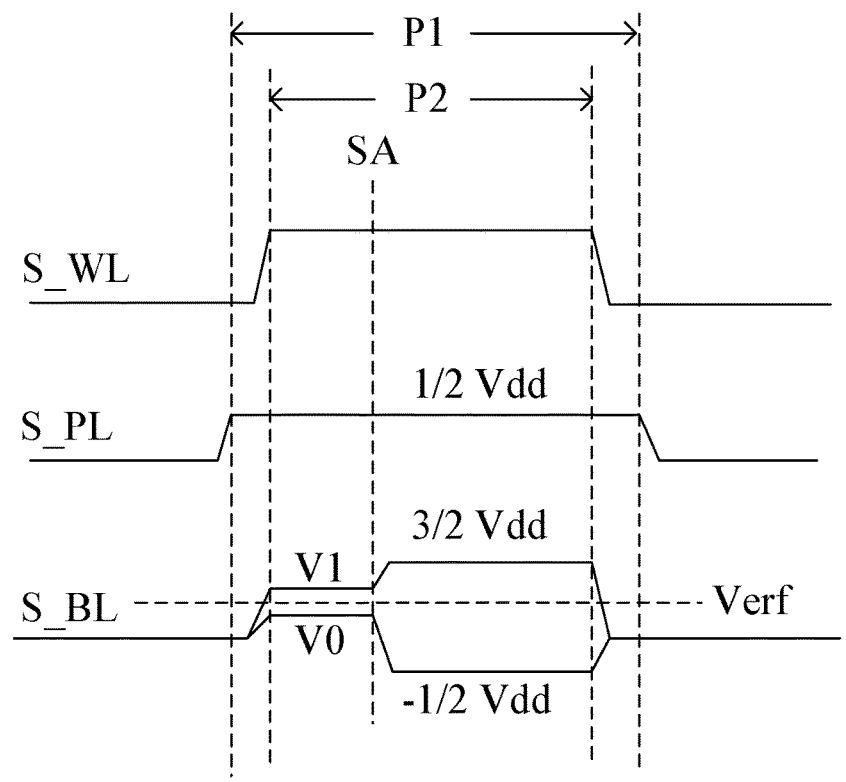
FIG. 5 is a timing diagram of a data reading method of the ferroelectric memory of FIG. 1 according to an embodiment of the present disclosure.

Please refer to both FIG. 1 and FIG. 5, wherein FIG. 5 is a timing diagram of a data reading method of the ferroelectric memory of FIG. 1 according to an embodiment of the present disclosure. Taking the ferroelectric memory cell 110 in FIG. 1 as an example, while reading the data from the ferroelectric memory cell 110, the signal S_PL is provided to the plate line PL(1), and the signal S_WL is provided to the word line WL(2). Then, the voltage level of the bit line BL(1) is affected by the data stored in the ferroelectric capacitor C of the ferroelectric memory cell 110 and changes to form a data signal. By comparing the data signal and a reference level, the data content represented by the data signal may be known according to the relation between the data signal and the reference level. Hence, the data stored in the ferroelectric memory cell 110 is obtained and output. Lastly, because the voltage level stored by the ferroelectric capacitor C may be changed during the aforementioned data reading operation, it needs to utilize the data writing method of FIG. 4 to rewrite the identical data into the ferroelectric capacitor C of the ferroelectric memory cell 110 after obtaining the data content represented by the data signal according to the relation between the data signal and the reference level. It is to be noted that the voltage level of the signal S_PL during the first time period P1 is different from that outside the first time period P1. The voltage level of the signal S_WL during the second time period P2 is different from that outside the second time period P2. The first time period P1 entirely covers the second time period P2. The voltage level of the signal S_PL is constant during the first time period P1.

Specifically, while reading the data from the ferroelectric memory cell 110, the voltage level of the signal S_PL provided to the plate line PL(1) is adjusted to (½)*Vdd at the beginning of the first time period P1 and kept constant during the whole first time period P1. Then, the voltage level of the signal S_WL provided to the word line WL(2) is adjusted to be sufficient to switch on the FET T of the ferroelectric memory cell 110 during the second time period P2. At the same time, along with switching-on of the FET T, the voltage level of the ferroelectric capacitor C starts to affect the voltage level of the BL(1). In this embodiment, it is assumed that the voltage level of the ferroelectric capacitor C is high represents logic "1" and that the voltage level of the ferroelectric capacitor C is low represents logic "0". Thus, when the FET T is switched on, the ferroelectric capacitor C with stored logic "1" changes the voltage level of the bit line BL(1) to V1. On the contrary, when the FET T is switched on, the ferroelectric capacitor C with stored logic "0" changes the voltage level of the bit line BL(1) to V0. The values of V1 and V0 relate to the electric potential difference Vdd for programming the ferroelectric capacitor C, the current capacitance of the ferroelectric capacitor C and the capacitance of the bit line BL(1), which is well known by persons skilled in the art and shall not be recited anymore.

In this embodiment, after the FET T is switched on for a period, a voltage sensing amplifier (not shown) is activated at the time point SA to judge the relation between the voltage level of the bit line BL(1) and the reference level Vref, so as to confirm whether the voltage level (data signal) of the bit line BL(1) represents logic "0" or logic "1". In this embodiment, the reference level Vref may be an average of the voltage levels V1 and V0. If the data signal is greater than the reference level Vref, the data signal represents logic "1". On the contrary, if the data signal is smaller than the reference level Vref, the data signal represents logic "0". After the content of the data signal is determined, the content of the data signal is output and viewed as the data stored in the ferroelectric memory cell 110.

After obtaining the content represented by the data signal, the technique provided in the embodiment is used to write the data into the ferroelectric capacitor C of the ferroelectric memory cell 110 again. In other words, if the content of the data signal represents logic "1", the voltage level of the data signal provided to the bit line BL(1) is adjusted to a specified data write level, e.g. (3/2)*Vdd, to program the ferroelectric capacitor C again to the voltage level representing logic "1" through the potential difference between the voltage levels of the bit line BL(1) and the plate line PL(1). On the contrary, if the content of the data signal represents logic "0", the voltage level of the data signal provided to the bit line BL(1) is adjusted to the other specified data write level, e.g. (−½)*Vdd, to program the ferroelectric capacitor C again to the voltage level representing logic "0" through the potential difference between the voltage levels of the bit line BL(1) and the plate line PL(1).

After the data is written into the ferroelectric capacitor C again, the second time period P2 ends. While the second time period P2 ends, the voltage level of the signal S_WL provided to the word line WL(2) starts falling till the voltage level of the signal S_WL provided to the word line WL(2) is insufficient to keep switching on the FET T. Meanwhile, the voltage level of the data signal S_BL on the bit line BL(1) is adjusted to the default voltage level other than and falling between the two specified data write levels. Lastly, the first time period P1 ends, and the voltage level of the signal S_PL provided to the plate line PL(1) is adjusted to the voltage level which is identical to the voltage level before the first time period P1 begins. Thus, the data reading method is finished.

It is to be noted that the data writing operation performed on the ferroelectric memory cell 110 after the time point SA may refer to the timing diagram of FIG. 4 without affecting the normal operation of the technique provided by the disclosure.

Figure 2:
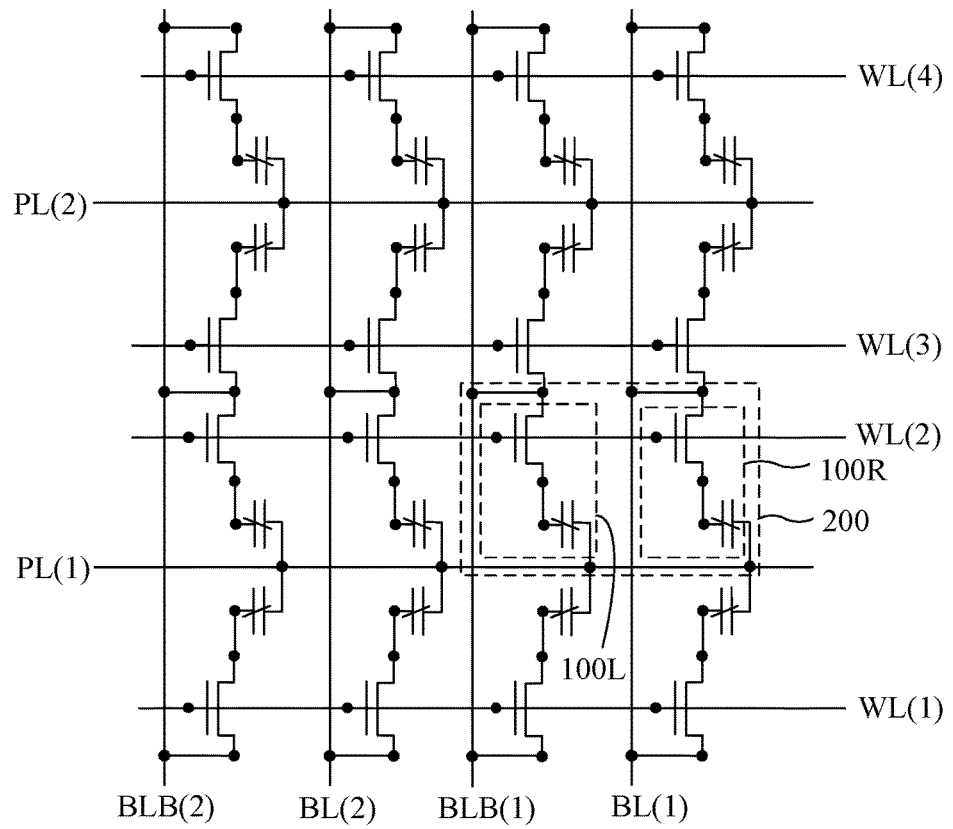
FIG. 2 is a circuit diagram illustrating a portion of a ferroelectric memory according to another embodiment of the present disclosure.
Figure 6A:
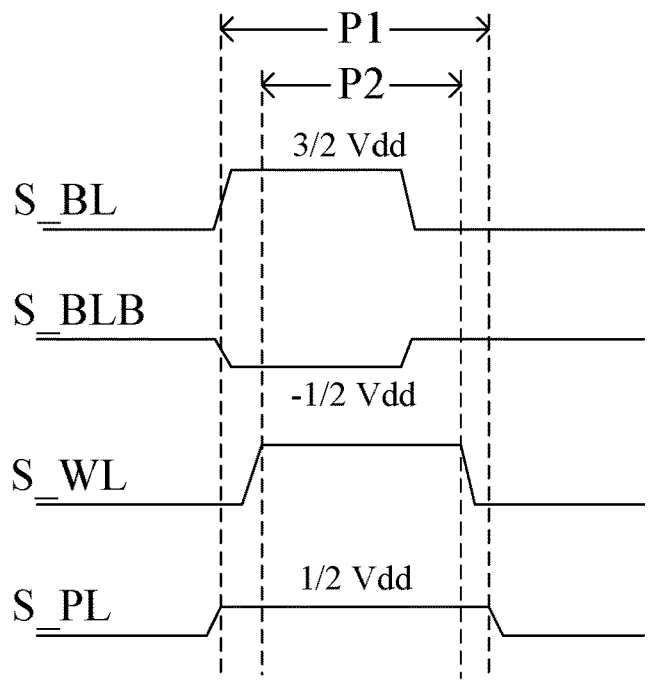
FIG. 6A is a timing diagram of a data writing method of the ferroelectric memory of FIG. 2 according to an embodiment of the present disclosure.

Please refer to both FIG. 2 and FIG. 6A, wherein FIG. 6A is a timing diagram of a data writing method of the ferroelectric memory in FIG. 2 according to an embodiment of the present disclosure. Taking the ferroelectric memory cell 200 in FIG. 2 as an example, the signal S_WL indicates the timing sequence of the voltage levels of the word line WL(2), the signal S_PL indicates the timing sequence of the voltage levels of the plate line PL(1), the signal S_BL indicates the timing sequence of the voltage levels of the bit line BL(1), and the signal S_BLB indicates the timing sequence of the voltage levels of the bit line BLB(1). In this embodiment, the criterion for judging the content stored in the ferroelectric memory cell 200 is the arrangement of the content stored in the ferroelectric memory cell 100L at the left side (the left part 100L) and the content stored in the ferroelectric memory cell 100R at the right side (the right part 100R) within the ferroelectric memory cell 200. For example, if the content stored in the left part 100L of the ferroelectric memory cell 200 is logic "1" or a relatively higher voltage level, and the content stored in the right part 100R of the ferroelectric memory cell 200 is logic "0" or a relatively lower voltage level, it is deemed that the content stored in the ferroelectric memory cell 200 is logic "1".

Under this condition, if the content stored in the left part 100L of the ferroelectric memory cell 200 is logic "0" or a relatively lower voltage level and the content stored in the right part 100R of the ferroelectric memory cell 200 is logic "1" or a relatively higher voltage level, it is deemed that the content stored in the ferroelectric memory cell 200 is logic "0". Alternatively, the content stored in the ferroelectric memory cell 200 may be determined according to an opposite scenario. For example, if the content stored in the left part 100L of the ferroelectric memory cell 200 is logic "1" or a relatively higher voltage level and the content stored in the right part 100R of the ferroelectric memory cell 200 is logic "0" or a relatively lower voltage level, it is deemed that the content stored in the ferroelectric memory cell 200 is logic "0". Under this condition, if the content stored in the left part 100L of the ferroelectric memory cell 200 is logic "0" or a relatively lower voltage level and the content stored in the right part 100R of the ferroelectric memory cell 200 is logic "1" or a relatively higher voltage level, it is deemed that the content stored in the ferroelectric memory cell 200 is logic "1".

No matter which scenario is adopted, it has to write opposite data into the left part 100L and the right part 100R of the ferroelectric memory cell 200 during the process of writing data into the ferroelectric memory cell 200. Referring to FIG. 6A, the signal S_BL, the signal S_WL and the signal S_PL are used for writing data into the right part 100R of the ferroelectric memory cell 200, while the signal S_BLB, the signal S_WL and the signal S_PL are used for writing data into the left part 100L of the ferroelectric memory cell 200. In the data writing method as shown in FIG. 6A, data writing operation of any pair of the left part 100L and the right part 100R is extremely similar to that shown in FIG. 4. Although the time point of the rising edge or the falling edge of the signal S_BL or the signal S_BLB in FIG. 4 may be different from that as shown in FIG. 6A, it won't affect result of operation of FIG. 6A. In other words, the data writing method of FIG. 4 is slight different from the data writing method of FIG. 6A in the timing, the specific operation principle does not change. Therefore, the operation procedure of FIG. 6A may be derived from directly referring to the description with reference to FIG. 4 together with making slight modifications, and repetitious details are not given here.

Figure 6B:
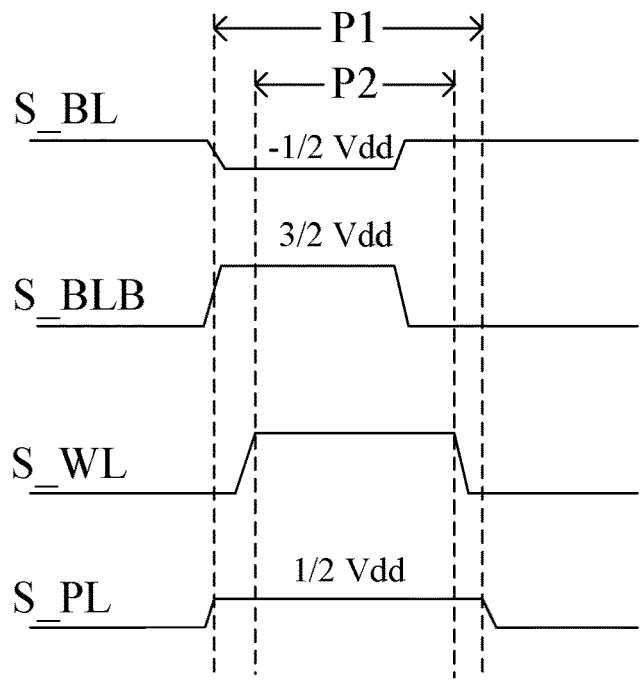
FIG. 6B is a timing diagram of a data writing method of the ferroelectric memory of FIG. 2 according to another embodiment of the present disclosure.

Please refer to both FIG. 2 and FIG. 6B, wherein FIG. 6B is a timing diagram of a data writing method of the ferroelectric memory of FIG. 2 according to another embodiment of the present disclosure. Similar to FIG. 6A, the signal S_BL, the signal S_WL and the signal S_PL are used for writing data into the right part 100R of the ferroelectric memory cell 200, while the signal S_BLB, the signal S_WL and the signal S_PL are used for writing data into the left part 100L of the ferroelectric memory cell 200. The method of FIG. 6A differs from the method of FIG. 6B in that the timing of the potential change of the signal S_BL in FIG. 6B is the same as the timing of the potential change of the signal S_BLB in FIG. 6A, and the timing of the potential change of the signal S_BLB in FIG. 6B is the same as the timing of the potential change of the signal S_BL in FIG. 6A. Hence, the data writing method in connection with FIG. 6B also accords with the description with reference to FIG. 4, and repetitious details are not given here.

From another perspective, the data writing method with reference to FIG. 4 may be used to drive each of the left part 100L and the right part 100R of the ferroelectric memory cell 200 in FIG. 5, provided one point must be noted, that is, the left part 100L and the right part 100R have to be written with opposite data.

Figure 7A:
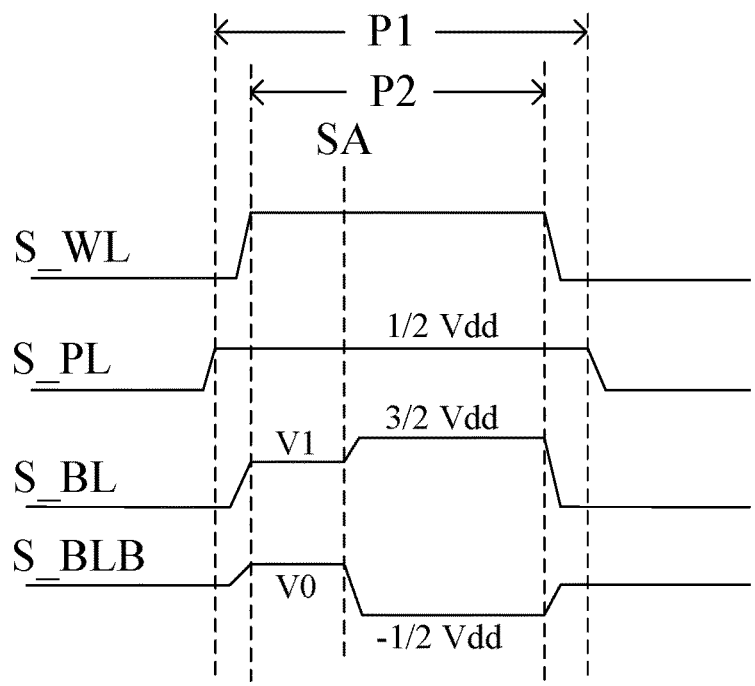
FIG. 7A is a timing diagram of a data reading method of the ferroelectric memory of FIG. 2 according to an embodiment of the present disclosure.
Figure 7B:
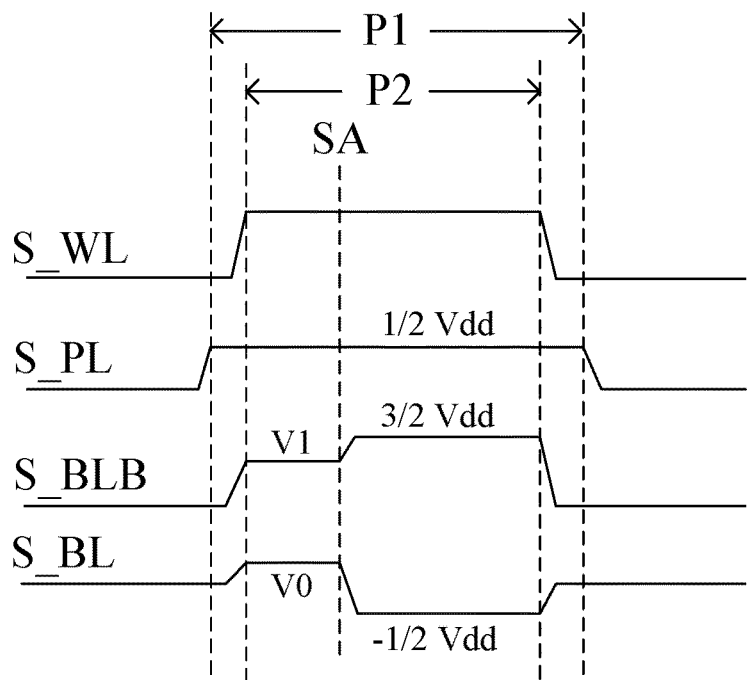
FIG. 7B is a timing diagram of a data reading method of the ferroelectric memory of FIG. 2 according to another embodiment of the present disclosure.

Please refer to FIG. 2, FIG. 7A and FIG. 7B. FIG. 7A is a timing diagram of a data reading method of the ferroelectric memory of FIG. 2 according to an embodiment of the present disclosure, and FIG. 7B is a timing diagram of a data reading method of the ferroelectric memory of FIG. 2 according to another embodiment of the present disclosure. Taking the ferroelectric memory cell 200 in FIG. 2 as an example, the signal S_WL indicates the timing sequence of the voltage levels of the word line WL(2), the signal S_PL indicates the timing sequence of the voltage levels of the plate line PL(1), the signal S_BL indicates the timing sequence of the voltage levels of the bit line BL(1), and the signal S_BLB indicates the timing sequence of the voltage levels of the bit line BLB(1). The signal S_BL, the signal S_WL and the signal S_PL are used for data writing/reading operation of the right part 100R of the ferroelectric memory cell 200, while the signal S_BLB, the signal S_WL and the signal S_PL are used for data writing/reading operation of the left part 100L of the ferroelectric memory cell 200. In the embodiment, the criterion for judging the content stored in the ferroelectric memory cell 200 is the arrangement of the content stored in the left part 100L and the content stored in the right part 100R. The related description has been given above, and repetitious details are not given here.

In the data reading methods of FIG. 7A and FIG. 7B, the data reading operation of any of the left part 100L and the right part 100R is the same as that of the counterpart described with reference to FIG. 5. Therefore, the operation procedures and principles in connection with FIG. 7A and FIG. 7B may be known by referring to the description with reference to FIG. 5, and repetitious details are not given here.

Figure 8:
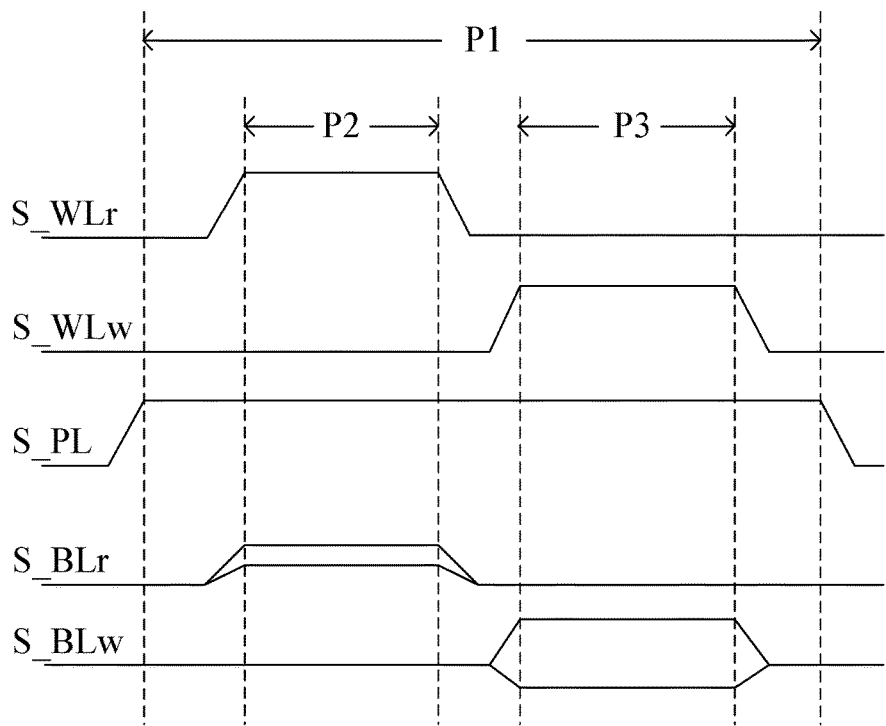
FIG. 8 is a timing diagram of a data reading method of the ferroelectric memory of FIG. 3 according to an embodiment of the present disclosure.

Please refer to both FIG. 3 and FIG. 8, wherein FIG. 8 is a timing diagram of a data reading method of the ferroelectric memory of FIG. 3 according to an embodiment of the present disclosure. Taking the ferroelectric memory cell 300 in FIG. 3 as an example, while reading the data stored in the ferroelectric memory cell 300, the voltage level of the signal S_PL is raised to a higher level (e.g. (½)*Vdd) at the beginning of the first time period P1 and provided to the plate line PL(2). Then, the voltage level of the signal S_WLr provided to the word line WLr(1) is adjusted to be sufficient to switch on the FET T2 of the ferroelectric memory cell 300 during the second time period P2. At this time, because of switching-on of the FET T2, the voltage level stored in the ferroelectric capacitor C within the ferroelectric memory cell 300 will affect the voltage level of the data signal S_BLr on the bit line BL(3) via the FET T2. As described above, the voltage level of the data signal S_BLr changes with the data stored in the ferroelectric capacitor C. Therefore, the data stored in the ferroelectric capacitor C can be determined by sampling the data signal S_BLr during the time period P2. The related techniques may be known from aforementioned embodiments and shall not be recited again here. After sampling the data signal S_BLr, the second time period P2 ends, and the voltage level of the data signal S_BLr is adjusted to the voltage level before being subjected to affection of the ferroelectric capacitor C. The signal S_WLr is also adjusted to a level incapable of switching on the FET T2.

As described above, reading data from the ferroelectric capacitor C may deteriorate the data stored in the ferroelectric capacitor C. Therefore, in the embodiment, after the second time period P2, the voltage level of the signal S_WLw provided to the word line WLw(1) is adjusted to be sufficient to switch on the FET T1 of the ferroelectric memory cell 300 during a third time period P3. Also, the voltage level of the data signal S_BLw provided to the bit line BL(2) is adjusted according to the type of the known data stored in the ferroelectric capacitor C during the third time period P3. Therefore, the voltage level on the bit line BL(2) is applied to the capacitor electrode 320 via the conductive FET T1, and the ferroelectric capacitor C is written with the data again. After writing the ferroelectric capacitor C with the data again, the third time period P3 ends. Once the third time period P3 ends, the voltage level of the data signal S_BLw is adjusted to the original voltage level, and the voltage level of the signal S_WLw is adjusted to switch off the FET T1.

By above method, the data stored in the ferroelectric memory cell 300 can be properly read out, and the original data is guaranteed unchanged.

Furthermore, if one would like to write data into a ferroelectric memory cell, it only needs to perform the aforementioned operations during the first and third periods for achieving his objective. The only thing which needs to be noted is that the data signal S_BLw is adjusted according to the data to be written into the ferroelectric memory cell 300 regardless of the originally stored data.

It is to be noted that the transistors in the above embodiments are illustrated by taking as field effect transistors, but it would suffice to use transistors without ferroelectric characteristics, such as non-ferroelectric transistors or non-ferroelectric FETs.

A manufacturing method of the ferroelectric memory 10 having an array structure as shown in FIG. 1 is described below. Please refer to FIG. 9A~FIG. 9E, schematic diagrams illustrating a manufacturing method of the ferroelectric memory according to an embodiment of the present disclosure. Only two ferroelectric memory cells 100 are shown in the drawing, but the ferroelectric memory 10 includes multiple ferroelectric memory cells 100 arranged in an array. Referring to the top view of the substrate shown in FIG. 10A, the schematic diagrams of FIG. 9A~FIG. 9E are side views viewed from the line A-A to the right. The column direction and the row direction in the embodiments are defined based on FIG. 10A~FIG. 10C.

As shown in FIG. 9A, at first, a semiconductor substrate 50 is provided. The semiconductor substrate 50 may be made of a known semiconductor material, e.g. silicon (Si). Shallow trench isolation (STI) is used to dispose one or more dielectric materials (e.g. silicon dioxide ($SiO_2$)) in trenches to form isolation regions 50c in the semiconductor substrate 50 to isolate and define active areas 50b where the FETs 52 will be formed (FIG. 10A). The active areas 50b may be optionally doped with a material of a first conductivity type.

Then, a first dielectric layer 51 and a word line WL are piled up (stacked) and formed over an upper surface 50a of a designated area 501 of the semiconductor substrate 50. The first dielectric layer 51 may optionally include a gate insulation layer 51a and/or a high-k dielectric layer 51b. This step may include sub-steps of: depositing an insulation layer (e.g. made of $SiO_2$ or silicon oxynitride (SiON)) and/or a high-k dielectric film and an electrode layer (e.g. made of titanium nitride (TiN), tantalum nitride (TaN), tungsten nitride (WN), wolfram (W), iridium (Ir), ruthenium (Ru), ruthenium oxide (RuOx), platinum (Pt), palladium (Pd) or other conductive material) in sequence; and patterning the piled deposition layers with a hard shield so that the remained deposition layers on the designated area 501 of the semiconductor substrate 50 form the gate insulation layer 51a and/or the high-k dielectric layer 51b and the word line WL. It is to be noted that the present disclosure is not limited to use the sub-steps. The shield may also be called as a mask or a mask plate. In the array structure, the ferroelectric memory cells in the same row (FIG. 10A) connect to a common word line WL. In other words, the word line WL extends along the row direction.

Subsequently, as shown in FIG. 9B, a source/drain doping step is performed by using the word line WL as the mask. Doping of a material of the second conductivity type is performed on the upper surface 50a of the semiconductor substrate 50. Major carriers of the material of the first conductivity type are opposite to major carriers of the second conductivity type. For example, if the material of the first conductivity type comprises p-type dopants, the material of the second conductivity type comprises n-type dopants, and vice verse. In this embodiment, an n-type dopant usable in the source/drain doping step may be, for example, arsenic (As) or phosphorus (P), and the doping concentration ranges form $5\times10^{19}$ $cm^{-3}$ to $2\times10^{21}$ $cm^{-3}$. Thus, in the active area 50b of the semiconductor substrate 50, a first doped region 52a and a second doped region 52b are formed in the vicinity of the designated area 501 and near the upper surface 50a of the semiconductor substrate 50. A high temperature annealing process may be performed at a temperature ranging from 850° C. to 1050° C. to active the dopants in each doped region. The doped regions 52a and 52b do not extend to the semiconductor substrate 50 underneath the first dielectric layer 51 in the drawings. However, it is applicable to use tilt-doping or thermal diffusion to extend the doped regions 52a and 52b to the semiconductor substrate 50 underneath the first dielectric layer 51. At this time, the top view of a part of the array in the resultant structure is shown in FIG. 10A. The FET 52 includes the first dielectric layer 51, the word line WL, the first doped region 52a, the second doped region 52b and the designated area 501 of the semiconductor substrate 50.

Then, as shown in FIG. 9C, a first interconnect 53a and a second interconnect 53b are formed over and electrically connected to the first doped region 52a and the second doped region 52b, respectively. FIG. 10B shows the top view of the structure at this moment. In the same column of the ferroelectric memory cells, the first interconnects 53a and the second interconnects 53b are staggered to prevent from contacting each other. The interconnects may be formed separately, concurrently, or partially concurrently. The disclosure does not limit the order of forming the interconnects, and one may make a plan in consideration of the process requirement, the minimal production cost or the shortest production time.

Figure 9E:
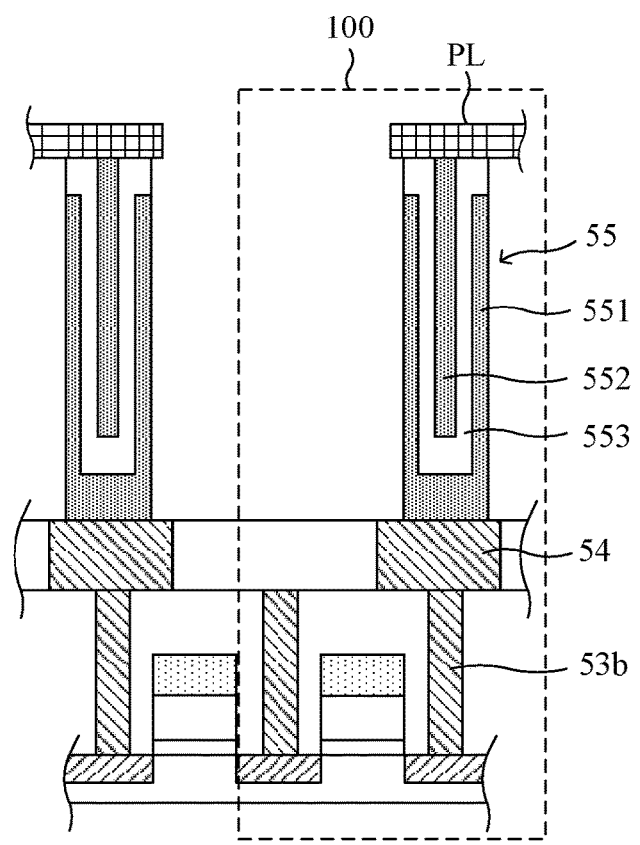
Figure 10A:
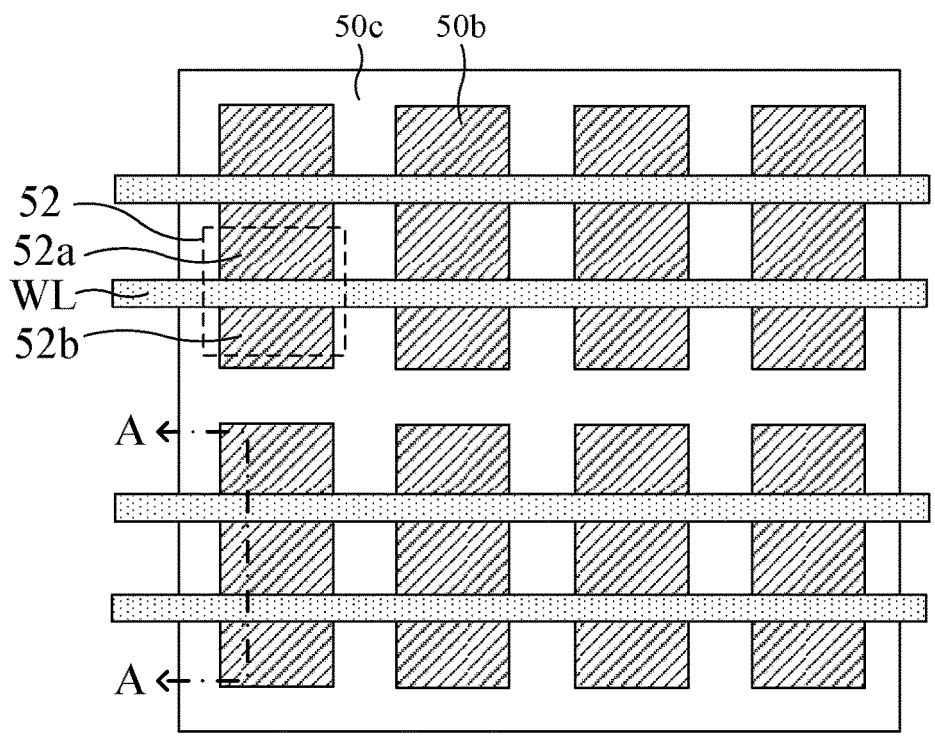
FIG. 10A~FIG. 10C are top views illustrating a portion of an array structure corresponding to FIG. 9B, FIG. 9C and FIG. 9E.
Figure 10B:
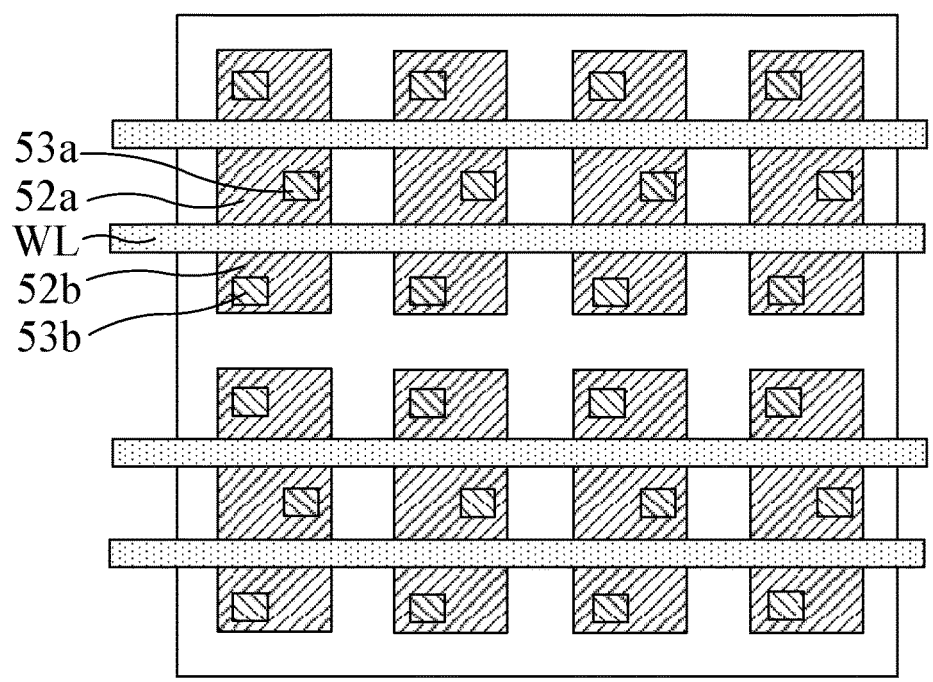
Figure 10C:
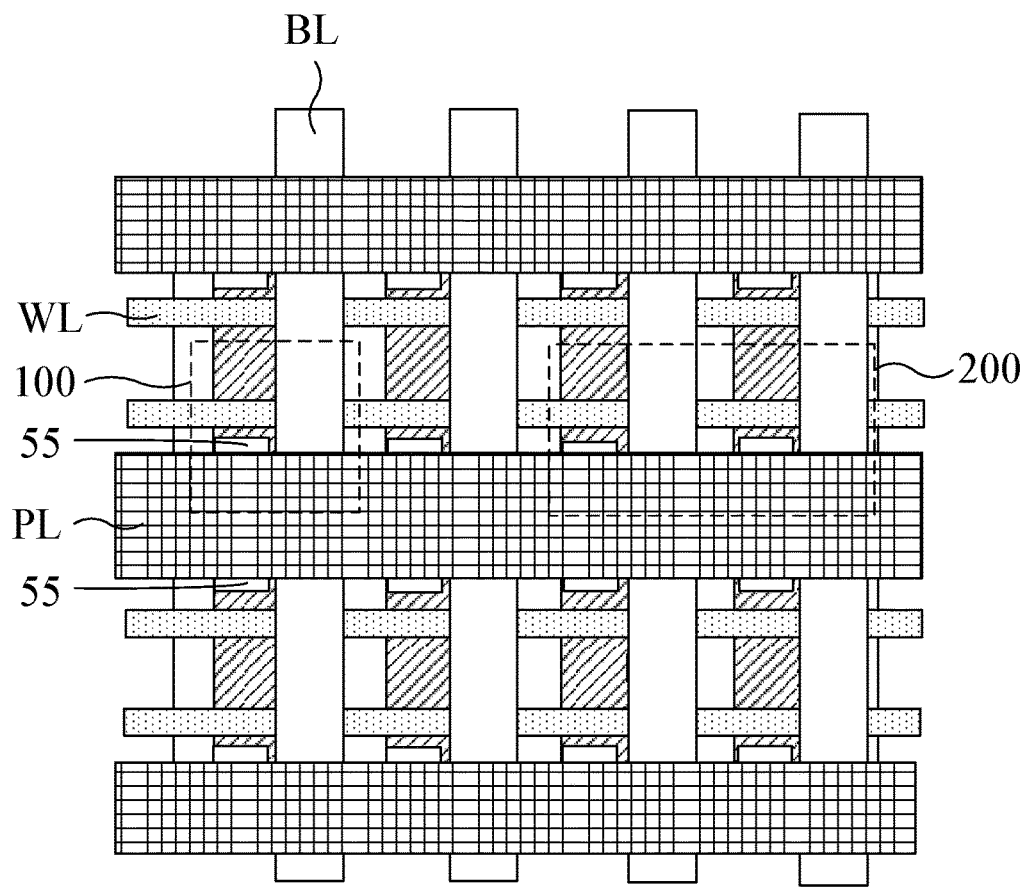

Subsequently, as shown in FIG. 9D, a bit line BL is formed to electrically connect the first interconnect 53a. The ferroelectric memory cells in the same column connect to a common bit line BL. In other words, the bit line BL extends along the column direction. Then, as shown in FIG. 9E, a ferroelectric capacitor 55 is formed. The ferroelectric capacitor 55 includes a first capacitor electrode 551, a second capacitor electrode 552 and a second dielectric layer 553 which separates the first capacitor electrode 551 from the second capacitor electrode 552. The first capacitor electrode 551 is electrically connected to the second interconnect 53b. In order to facilitate forming of the ferroelectric capacitor 55, a landing pad 54 may be optionally provided between the first capacitor electrode 551 of the ferroelectric capacitor 55 and the second interconnect 53b so as to have the landing pad 54 electrically connect to the first capacitor electrode 551 and the second interconnect 53b as well as pad the position for forming the ferroelectric capacitor 55. For example, an upper surface of the landing pad 54 is higher than or flush with an upper surface of the bit line BL. The disclosure does not limit the order of forming the bit line BL and the landing pad 54, the bit line BL and the landing pad 54 may be formed separately or concurrently, and one may make a plan in consideration of the process requirement, the minimal production cost or the shortest production time. Lastly, a plate line PL is formed to electrically connect the second capacitor electrode 552 of the ferroelectric capacitor 55. The ferroelectric memory cells in the same row connect to a common plate line PL. In other words, the plate line PL extends along the row direction (FIG. 10C). Thus, the ferroelectric memory 10 having the array structure as shown in FIG. 1 is finished. The ferroelectric memory 10 includes an array of the ferroelectric memory cells 100. After the above steps, associated processes of back-end-of-line (BEOL) can be performed.

Figure 10D:
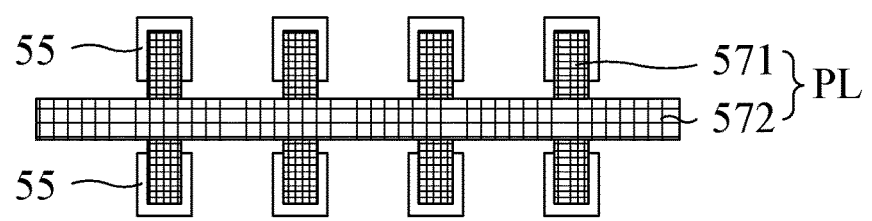
FIG. 10D is a top view illustrating another configuration of the plate line.

In terms of the array structure of FIG. 1, two ferroelectric capacitors 55 which are adjacent to each other in the column direction share a common plate line PL between them. FIG. 10C illustrates one configuration wherein one plate line PL covers the second capacitor electrodes 552 of two rows of the ferroelectric capacitors 55. The present disclosure is not limited to this configuration, and it is only required that one plate line PL should be electrically connected to the second capacitor electrodes 552 of two rows of the ferroelectric capacitors 55. For example, the plate line PL in FIG. 10C may be divided into two parallel strips for receiving the same signal S_PL, and each of the strips covers the second capacitor electrodes of one row of the ferroelectric capacitors. Or it is also feasible to use a two-layer plate line PL, just like that shown in FIG. 10D. For illustrative purposes, only one plate line PL and several ferroelectric capacitors 55 are shown, and other elements are omitted. First, each of multiple first conductive strips 571 is electrically connected to the second capacitor electrodes 552 of two adjacent ferroelectric capacitors 55 in the same column. Then, a second conductive strip 572 is electrically connected to the first conductive strips 571. Therefore, the second capacitor electrodes 552 of two adjacent rows of the ferroelectric capacitors 55 are electrically connected together. The plurality of first conductive strips 571 and the second conductive strip 572 constitute the plate line PL.

This manufacturing method may be used to finish the array structure of the ferroelectric memory 20 show in FIG. 2. In FIG. 10C, two adjacent ferroelectric memory cells 100 in the same row are deemed as one ferroelectric memory cell 200, multiple ferroelectric memory cell 200 arranged in an array then constitute the ferroelectric memory 20, and the manufacturing method of the ferroelectric memory 20 is not described in details again.

The structure, materials and manufacturing methods of the ferroelectric capacitors in this embodiments and the following embodiments will be described later after the description of the manufacturing methods of the ferroelectric memories.

A manufacturing method of the ferroelectric memory 30 having an array structure as shown in FIG. 3 is given now. Please refer to FIG. 11A~FIG. 11F, schematic diagrams illustrating a manufacturing method of the ferroelectric memory according to an embodiment of the present disclosure. Only one complete ferroelectric memory cell 300 is shown in the drawings, but the ferroelectric memory 30 includes multiple ferroelectric memory cells 300 arranged in an array. Referring to the top view of the substrate in FIG. 12A, the schematic diagrams of FIG. 11A~FIG. 11E are side views viewed from the line B-B to the right. The column direction and the row direction in the embodiments are defined based on FIG. 12A and FIG. 12B.

Figure 11A:
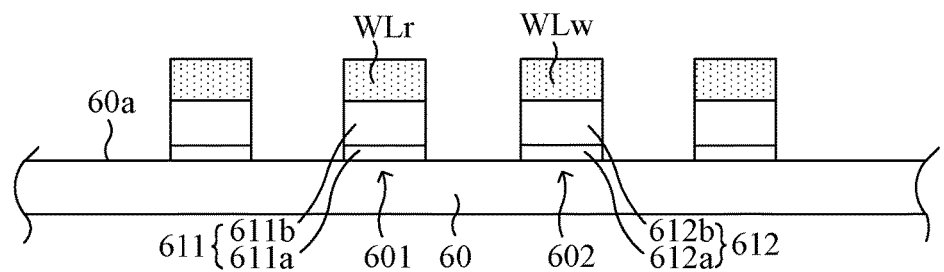
FIG. 11A~FIG. 11F are schematic diagrams illustrating the manufacturing method of a ferroelectric memory according another embodiment of the present disclosure.
Figure 12A:
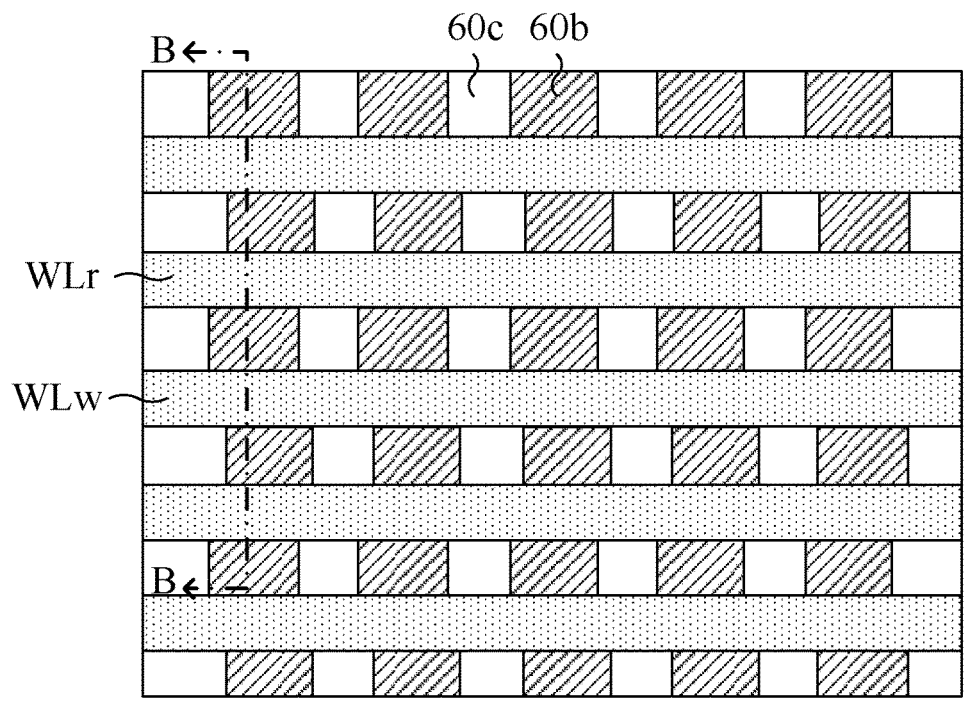
FIG. 12A and FIG. 12B are top views illustrating a portion of an array structure corresponding to FIG. 11B and FIG. 11C.

As shown in FIG. 11A, at first, a semiconductor substrate 60 is provided. The semiconductor substrate 60 may be made of a known semiconductor material, e.g. Si. Shallow trench isolation is used to dispose one or more dielectric materials (e.g. $SiO_2$) in trenches to form isolation regions 60c in the semiconductor substrate 60 to isolate and define active areas 60b where the FETs will be formed (FIG. 12A). The active areas 60b may be optionally doped with a material of a first conductivity type.

Then, a first dielectric layer 611 and a first word line WLr are piled up and formed over an upper surface 60a of a first area 601 of the semiconductor substrate 60. The first dielectric layer 611 may optionally include a gate insulation layer 611a and/or a high-k dielectric layer 611b. Meanwhile, a third dielectric layer 612 and a second word line WLw are piled up and formed over the upper surface 60a of a second area 602 of the semiconductor substrate 60. The third dielectric layer 612 may optionally include a gate insulation layer 612a and/or a high-k dielectric layer 611b. This step may include sub-steps of: depositing insulation layers (e.g. made of $SiO_2$ or SiON) and/or high-k dielectric films and electrode layers (e.g. made of TiN, TaN, WN, W, Ir, Ru, RuOx, Pt, Pd or other conductive material) in sequence; and patterning the piled deposition layers with hard shields so that the remained deposition layers on the areas 601, 602 of the semiconductor substrate 60 form the gate insulation layers 611a, 612a and/or the high-k dielectric layers 611b, 612b and the word lines WLr, WLw. However, the present disclosure is not limited to the above sub-steps. In the array structure, the ferroelectric memory cells in the same row connect to a common first word line WLr, and the ferroelectric memory cells in the same row connect to a common second word line WLw (FIG. 12A). In other words, the first word line WLr and the second word line WLw extend along the row direction.

Figure 11B:
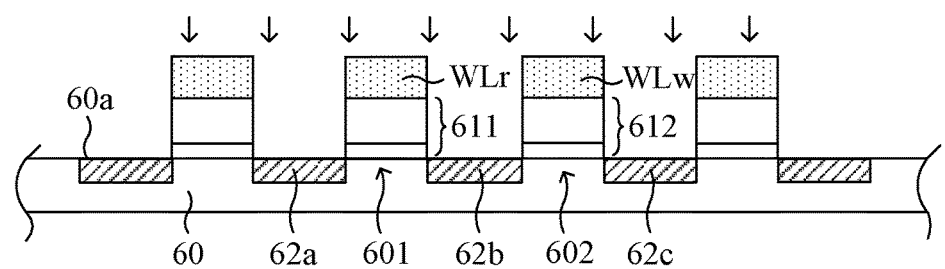
Figure 12B:
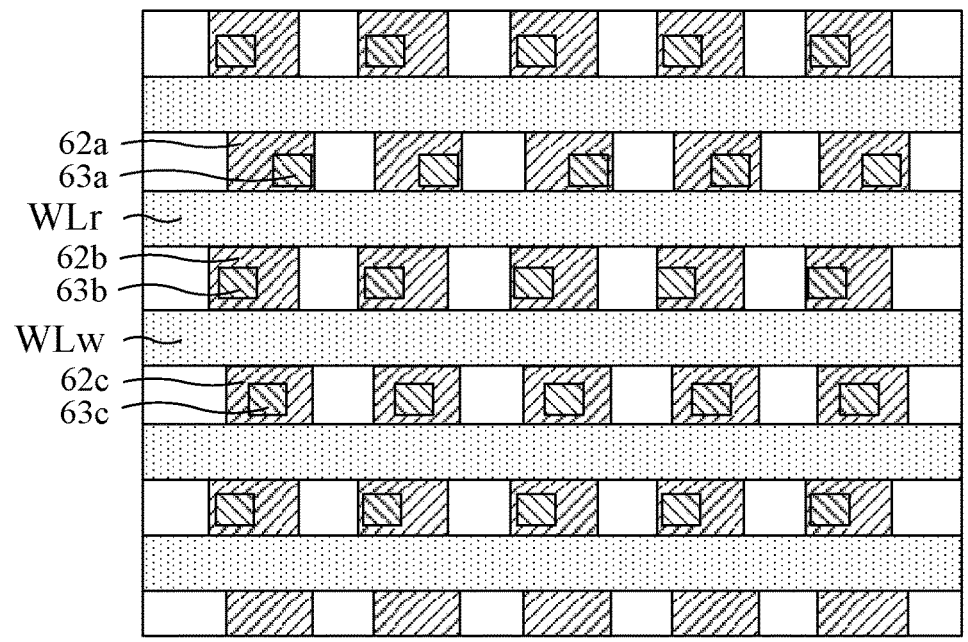

Subsequently, as shown in FIG. 11B, a source/drain doping step is performed by using the first word line WLr and the second word line WLw as the masks. Doping of a material of the second conductivity type is performed on the upper surface 60a of the semiconductor substrate 60. Major carriers of the material of the first conductivity type are opposite to major carriers of the material of the second conductivity type. For example, if the material of the first conductivity type comprises p-type dopants, the material of the second conductivity type comprises n-type dopants, and vice verse. In this embodiment, an n-type dopant usable in the source/drain doping step may be, for example, As or P, and the doping concentration ranges form $5\times10^{19}$ cm$^{-3}$ to $2\times10^{21}$ cm$^{-3}$. Thus, in the active area 60b of the semiconductor substrate 60, a first doped region 62a is formed on the left of the first area 601 and near the upper surface 60a of the semiconductor substrate 60, a second doped region 62b is formed between the first area 601 and the second area 602 and near the upper surface 60a of the semiconductor substrate 60, and a third doped region 62c is formed on the right of the second area 602 and near the upper surface 60a of the semiconductor substrate 60. A high temperature annealing process may be performed at a temperature ranging from 850° C. to 1050° C. to active the dopants in the doped regions 62a, 62b and 62c. The doped regions 62a, 62b and 62c do not extend to the semiconductor substrate 60 underneath the first dielectric layer 611 and the second dielectric layer 612 in the drawings. However, it is applicable to use tilt-doping or thermal diffusion to extend the doped regions 62a, 62b and 62c to the semiconductor substrate 60 underneath the first dielectric layer 611 and the second dielectric layer 612. At this time, the top view of a part of the array in the resultant structure is shown in FIG. 12B. The first FET includes the first dielectric layer 611, the first word line WLr, the first doped region 62a, the second doped region 62b and the first area 601 of the semiconductor substrate 60. The second FET includes the third dielectric layer 612, the second word line WLw, the second doped region 62b, the third doped region 62c and the second area 602 of the semiconductor substrate 60.

Figure 11C:
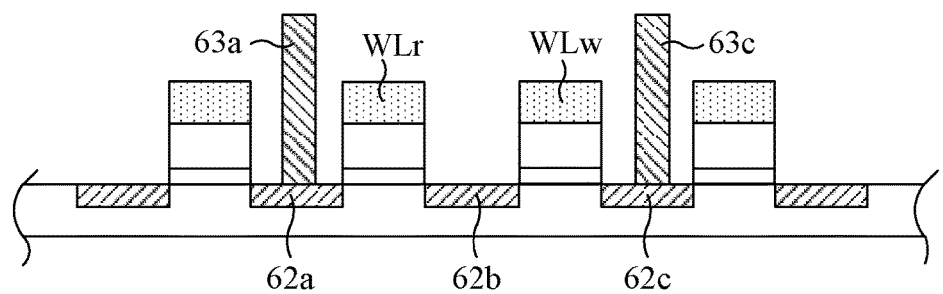

Then, as shown in FIG. 11C, a first interconnect 63a and a third interconnect 63c are formed over and electrically connected to the first doped region 62a and the third doped region 62c, respectively. The first interconnect 63a and the third interconnect 63b may be formed in a specific order or at the same time. The interconnects may be formed separately, concurrently, or partially concurrently. The disclosure does not limit the order of forming the interconnects, and one may make a plan in consideration of the process requirement, the minimal production cost or the shortest production time.

Figure 11D:
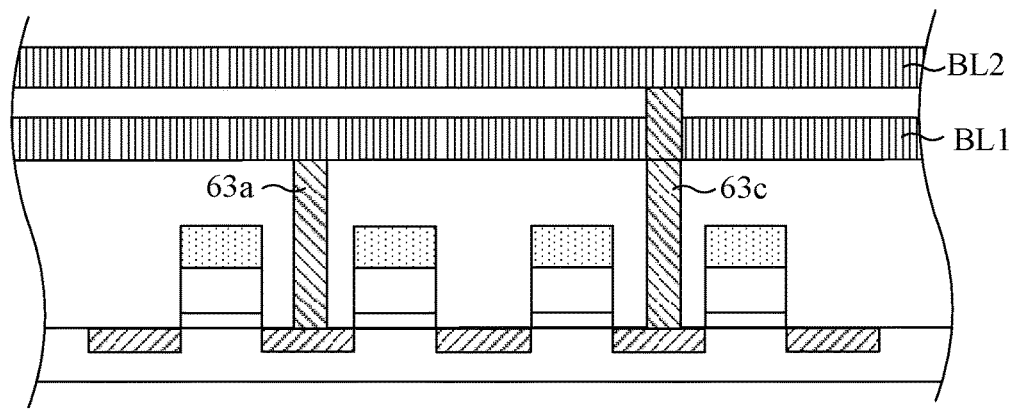

Subsequently, as shown in FIG. 11D, a first bit line BL1 electrically connected to the first interconnect 63a and a second bit line BL2 electrically connected to the third interconnect 63c are formed. The ferroelectric memory cells in the same column connect to a common first bit line BL1, and also the ferroelectric memory cells in the same column connect to a common second bit line BL2. In other words, the bit lines BL1 and BL2 extend along the column direction. In the array structure, for making the first bit line BL1 and the second bit line BL2 staggered, the first bit line BL1 and the second bit line BL2 are arranged at different heights in the embodiment. For example, the position of the second bit line BL2 is higher than the position of the first bit line BL1. To establish electrical connections, it is necessary to correspondingly pad the height of a specific interconnect, but the present disclosure does not limit the arrangement order of the heights of the interconnects. It is feasible to lay out the relative position and forming sequence of the first bit line BL1 and the second bit line BL2 according to manufacturing process schedule. Parallel lines may have the same height and be formed simultaneously.

Figure 11E:
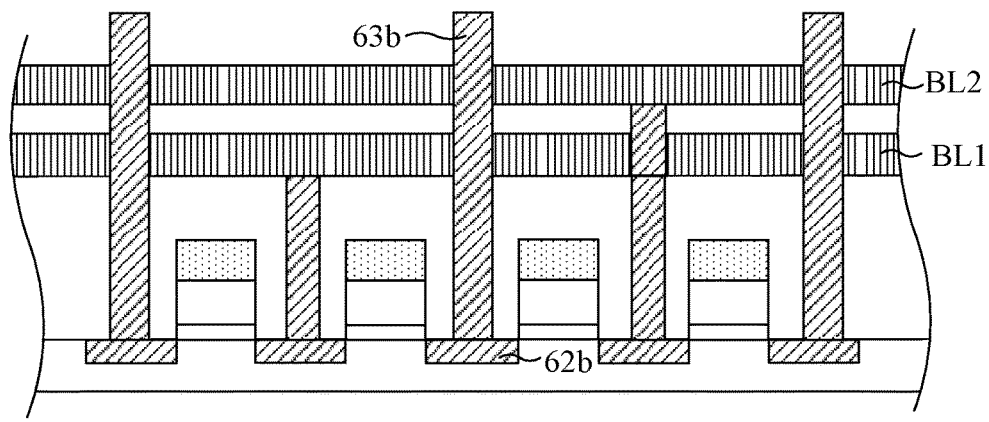

Then, as shown in FIG. 11E, a second interconnect 63b is formed over and electrically connected to the second doped region 62b. The top end of the second interconnect 63b exceeds the upper surface of the bit lines BL1 and BL2 or is at least flush with the upper surface of the higher bit line. FIG. 12B shows the top view of a part of the structure at this moment. For clarity, the bit lines BL1 and BL2 are hidden. It can be seen that in the same column of ferroelectric memory cells, the first interconnects 63a, the second interconnects 63b and the third interconnects 63c are staggered along the row direction so as to prevent the non-corresponding first interconnects 63a, second interconnects 63b and third interconnects 63c from contacting the first bit line BL1, the second bit line BL2, the ferroelectric capacitor, the plate line and the which will be formed later.

Figure 11F:
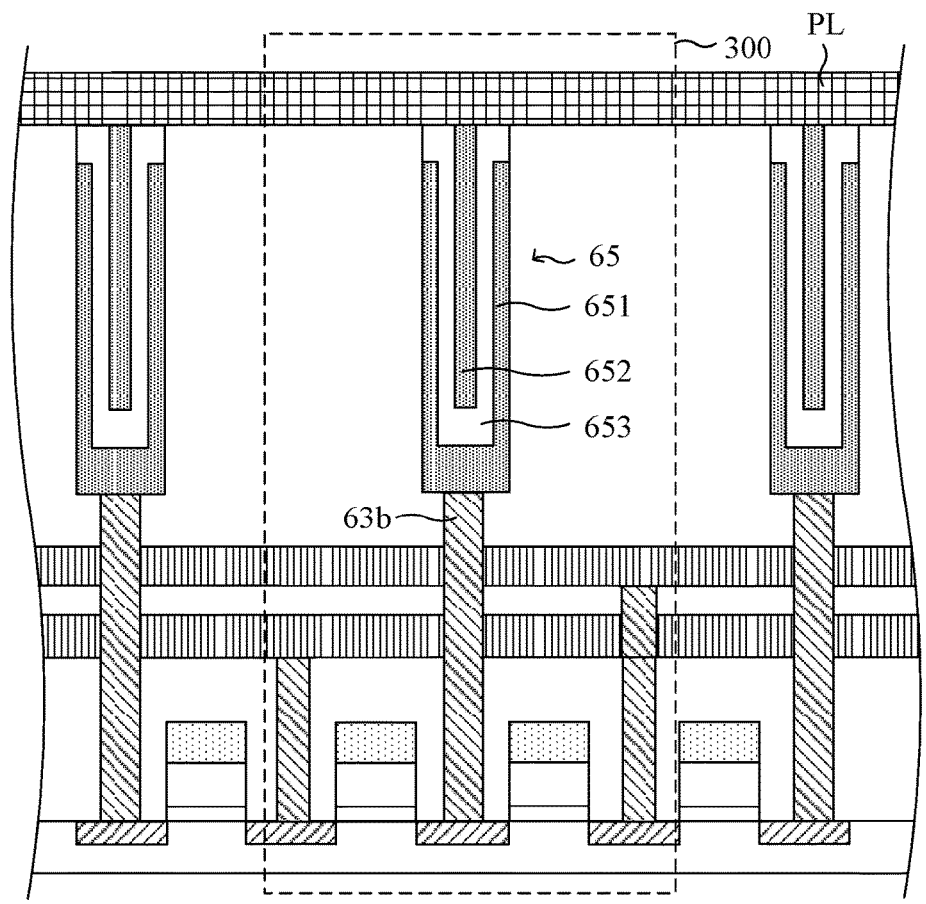

Then, as shown in FIG. 11F, a ferroelectric capacitor 65 is formed. The ferroelectric capacitor 65 includes a first capacitor electrode 651, a second capacitor electrode 652 and a second dielectric layer 653 which separates the first capacitor electrode 651 from the second capacitor electrode 652. The first capacitor electrode 651 is electrically connected to the second interconnect 63b. Lastly, a plate line PL is formed and electrically connected to the second capacitor electrode 652 of the ferroelectric capacitor 65. The ferroelectric memory cells in the same column connect to a common plate line PL. In other words, the plate line PL extends along the column direction. Thus, the ferroelectric memory 30 having the array structure as shown in FIG. 3 is finished. The ferroelectric memory 30 includes a plurality of ferroelectric memory cells 300 arranged in an array. After the above steps, associated processes of back-end-of-line (BEOL) can be performed.

The manufacturing processes in the foregoing embodiments are illustrated only in connection with each component capable of forming electric connection, and blank portions in the drawings will be isolated and protected by using insulation materials. Forming of the insulation materials is interposed into each of the aforementioned steps and may involve steps of depositing, patterning, etching, filling and etc. A person skilled in the art may understand these processes by deriving from his knowledge, so detailed description shall not be given here.

In the description, the column direction and the row direction are used to illustrate the array structure of the ferroelectric memory and are not used to limit the directions of the elements. The column direction and the row direction are interchangeable in the applications.

Figure 13:
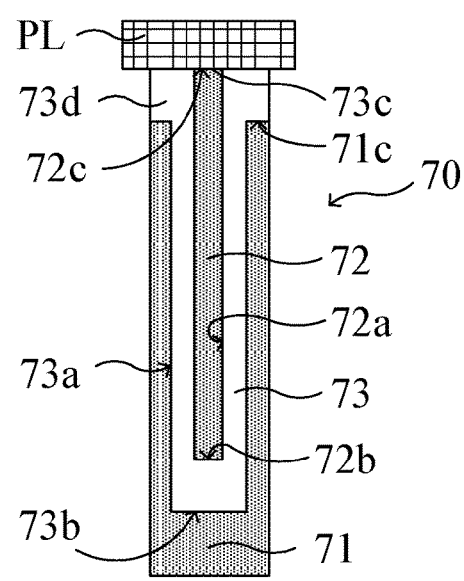
FIG. 13 is a side cross-sectional view illustrating a capacitor structure according to an embodiment of the present disclosure.

The ferroelectric capacitor of the ferroelectric memories in the above embodiments may have a traditional capacitor structure, e.g. a parallel-plate capacitor having two metallic plates separated by a dielectric medium wherein the dielectric medium is made of a ferroelectric material. The present disclosure further provides a capacitor structure. Please refer to FIG. 13 which illustrates a side cross-sectional view of a capacitor structure according to an embodiment of the present disclosure. The capacitor structure 70 includes a first capacitor electrode 71, a second capacitor electrode 72 and a dielectric layer 73 interposed between the two capacitor electrodes 71 and 72. The second capacitor electrode 72 includes a pillar structure, wherein the cross section of the top portion of the pillar structure is circular or square. The dielectric layer 73 covers the lateral surface 72a and the bottom surface 72b of the second capacitor electrode 72. The top surface 72c of the second capacitor electrode 72 is exposed from the upper opening 73c of the dielectric layer 73. The dielectric layer 73 further includes a flange 73d which neighbors with the upper opening 73c and extends along a direction away from the second capacitor electrode 72. The first capacitor electrode 71 covers the lateral surface 73a and the bottom surface 73b of the dielectric layer 73. The flange 73d of the dielectric layer 73 covers the top surface 71c of the first capacitor electrode 71. The plate line PL described in the above embodiments is in contact with the exposed top surface 72c of the second capacitor electrode 72 at the upper opening 73c of the dielectric layer 73. With limited base area, this type of capacitor structure can provide a larger surface area of the capacitor electrodes to increase the capacitance.

The first capacitor electrode 71 and the second capacitor electrode 72 of the capacitor structure 70 (or a parallel-plat capacitor structure) may be made of TiN, TaN, WN, W, Ir, Ru, RuOx, Pt, Pd or other conductive material. The material of the dielectric layer 73 may be a ferroelectric material. Some manufacturing methods of certain special ferroelectric materials are given in below description.

Figure 14:
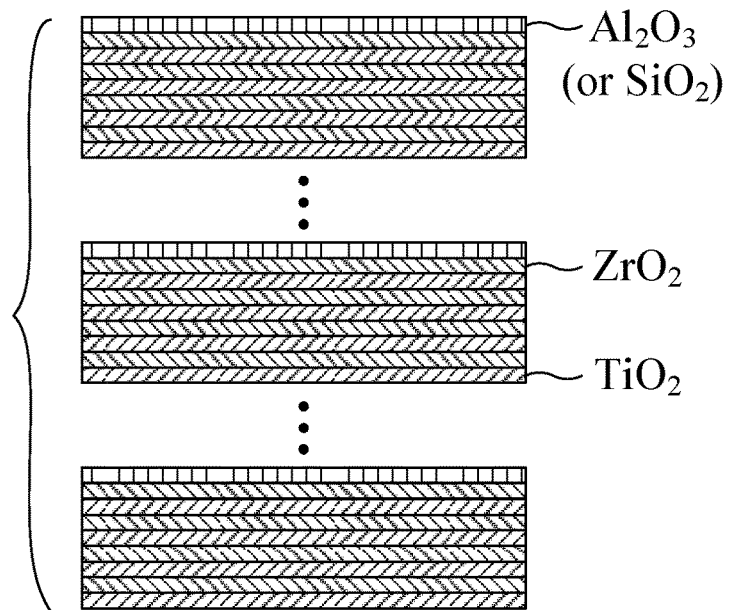
FIG. 14 is a schematic diagram illustrating the composition of the ferroelectric layer serving as the dielectric layer of the ferroelectric capacitor according to an embodiment of the present disclosure.

Please refer to FIG. 14, a schematic diagram illustrating the manufacturing method of the ferroelectric layer according to an embodiment of the present disclosure. For example, the ferroelectric layer is made of a $Ti_xZr_{(1-x)}O_y$ ferroelectric material doped with Al/Si, wherein the doping concentration ranges from 1% to 15%, preferably from 1% to 5%. The ferroelectric layer is formed by atomic layer deposition (ALD). The titanium dioxide ($TiO_2$) films and the zirconium dioxide ($ZrO_2$) films in the form of single atomic films are grown layer by layer repeatedly or alternately. By controlling the number of the $TiO_2$ film(s) and the $ZrO_2$ film(s) in each ALD cycle, the x value and the y value can be adjusted. For example, the x value ranges from 0.25 to 0.75, preferably from 0.4 to 0.6; and the y value ranges from 1.8 to 2.2, preferably from 1.9 to 2.1. By means of this manufacturing method, the thickness of the formed dielectric layer which is applied to the ferroelectric capacitor can be reduced to a range from 5 nm to 30 nm, even 5 nm to 15 nm.

In the embodiment shown in FIG. 14, the ratio of the number of the $TiO_2$ films to the number of the $ZrO_2$ films is 1:1. That is, the $TiO_2$ films and the $ZrO_2$ films are alternately deposited. One $TiO_2$ film and one $ZrO_2$ film constitute a process cycle, and the $TiO_2$ film and the $ZrO_2$ film are not limited as a top layer and a lower layer or as a lower layer and a top layer. In the meantime, the x value is 0.5 and the y value is 2. If the ratio of the number of the $TiO_2$ film(s) in each process cycle increases, the x value is greater than 0.5. On the contrary, if the ratio of the number of the $ZrO_2$ film(s) in each process cycle increases, the x value is smaller than 0.5. After several process cycles, at least one aluminum oxide ($Al_2O_3$) film or at least one $SiO_2$ film may be formed. In this embodiment, one $Al_2O_3$ film or one $SiO_2$ film is inserted after every four ALD cycles. Thus, the doping concentration of Al or Si is about 11%. When the number of cycles for stacking films is larger than ten, the doping concentration of Al or Si is smaller than 5%.

For forming the $TiO_2$ films, the $ZrO_2$ films, the $Al_2O_3$ films and/or the $SiO_2$ films, the oxidant may be ozone ($O_3$) or water ($H_2O$). The precursor for forming the $TiO_2$ films may be tetrakis(ethylmethylamino)titanium (TEMATi), tetrakis(dimethylamino) titanium (TDMATi) or titanium tetrachloride ($TiCl_4$), and the deposition temperature (reaction temperature) ranges from 150° C. to 400° C. The precursor for forming the $ZrO_2$ films may be tetrakis(ethylmethylamino)zirconium (TEMAZ), tetrakis(dimethylamino) zirconium (TDMAZ) or zirconium(IV) chloride ($ZrCl_4$), and the deposition temperature (reaction temperature) ranges from 150° C. to 400° C. The precursor for forming the $Al_2O_3$ films may be trimethylaluminum (TMA) or aluminum chloride ($AlCl_3$), and the deposition temperature (reaction temperature) ranges from 150° C. to 400° C. The precursor for forming the $SiO_2$ films may be tetrakis(dimethylamino) silane (4DMAS), tris(dimethylamino)silane (3DMAS), silicon tetrachloride ($SiCl_4$) or tetrakis(ethylmethylamino)silane (TEMA-Si), and the deposition temperature (reaction temperature) ranges from 150° C. to 400° C.

By this manufacturing method, the ferroelectric layer has more stable characteristics because the precision of the ALD method can be controlled at an atomic level. In addition, the ferroelectric layer also has the property of being conformal, so that doping concentration variation, thickness variation, temperature variation and stress variation, which are common in fabrication processes of a large size wafer, will have better tolerance.

The dopants Al or Si in the above embodiments may be replaced by Ti or Ta to adjust or reduce the coercive field (Ec). Please refer to FIG. 15, a schematic diagram illustrating the composition of the ferroelectric layer according to another embodiment of the disclosure. For example, the ferroelectric layer of the ferroelectric capacitor is made of a $Ti_xZr_{(1-x)}O_y$ ferroelectric material doped with Ti or Ta, wherein the doping concentration ranges from 1% to 15%, preferably from 1% to 5%. The ferroelectric layer is formed by ALD. $TiO_2$ and $ZrO_2$ in the form of single atomic films are grown layer by layer repeatedly or alternately. By controlling the number of the $TiO_2$ films and the $ZrO_2$ films in each process cycle, the x value and the y value can be adjusted. For example, the x value ranges from 0.25 to 0.75, preferably from 0.4 to 0.6; and the y value ranges from 1.8 to 2.2, preferably from 1.9 to 2.1.

Figure 15:
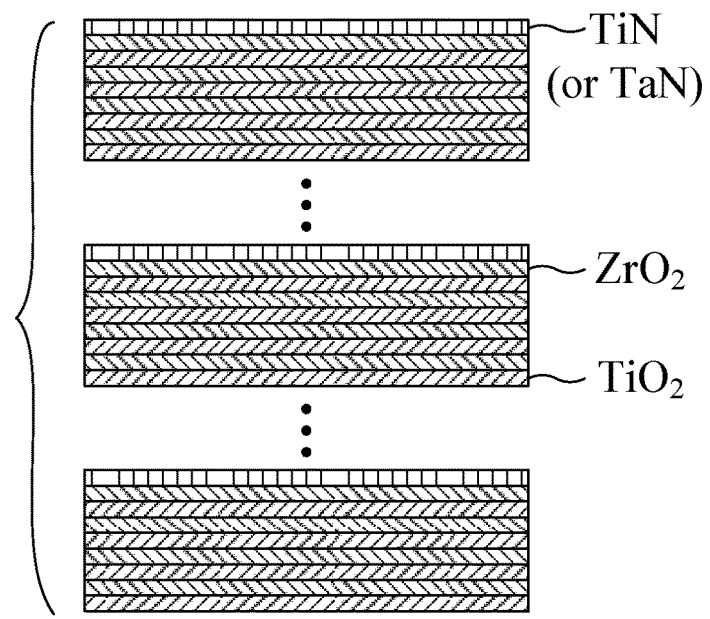
FIG. 15 is a schematic diagram illustrating the composition of the ferroelectric layer serving as the dielectric layer of the ferroelectric capacitor according to another embodiment of the present disclosure.

In the embodiment of FIG. 15, the ratio of the number of the $TiO_2$ films to the number of the $ZrO_2$ films is 1:1. That is, the $TiO_2$ films and the $ZrO_2$ films are alternately deposited. This disclosure is not limited to the case that the top layer is the $TiO_2$ film or the $ZrO_2$ in a process cycle. In the meantime, the x value is 0.5 and the y value is 2. If the ratio of the number of the $TiO_2$ film(s) in each process cycle increases, the x value is greater than 0.5. On the contrary, if the ratio of the number of the $ZrO_2$ film(s) in each process cycle increases, the x value is smaller than 0.5. After several process cycles, at least one TiN film or at least one TaN film may be formed. In this embodiment, one TiN film or one TaN film is inserted after every four process cycles. Thus, the doping concentration of Ti or Ta is about 11%. When the number of cycles for stacking films is larger than ten, the doping concentration of Ti or Ta is smaller than 5%.

For forming the $TiO_2$ films and the $ZrO_2$ films, the oxidant may be $O_3$ or $H_2O$, and the precursors and deposition temperature (reaction temperature) may refer to the above embodiments. For forming the TiN films or the TaN films, the nitrogen donating medium may be ammonia ($NH_3$). The precursor for forming the TiN films may be $TiCl_4$ or tetrakis (diethylamino)titanium (TDEAT), and the deposition temperature (reaction temperature) ranges from 200° C. to 500° C. The precursor for forming the TaN films may be tantalum (V) chloride ($TaCl_5$), tantalum(V) fluoride ($TaF_5$) or tantalum(V) bromide ($TaBr_5$), and the deposition temperature (reaction temperature) ranges from 200° C. to 500° C. By this manufacturing method, the formed ferroelectric layer identically has the advantage of being of stable characteristics.

Besides, the ferroelectric layer may be made of $Zr_{0.8x}Si_{0.2x}Ti_{(1-x)}O_y$ ferroelectric material. First, by ALD, the $Zr_{0.8}Si_{0.2}O_2$ films containing 20% Si is formed. The precursor for donating Zr may be TEMAZ, TDMAZ or $ZrCl_4$; the precursor for donating Si may be 4DMAS, 3DMAS, $SiCl_4$ or TEMA-Si; the oxidant may be $O_3$ or $H_2O$; and the deposition temperature (reaction temperature) ranges from 300° C. to 400° C. Then, using ALD to deposit the $Zr_{0.8}Si_{0.2}O_2$ films and the $TiO_2$ films according to a specific ratio so as to form $Zr_{0.8x}Si_{0.2x}Ti_{(1-x)}O_y$. The precursor for forming the $TiO_2$ films may be TEMATi, TDMATi or $TiCl_4$, and the deposition temperature (reaction temperature) ranges from 300° C. to 400° C. By controlling the number of the films in each process cycle, the x value and the y value can be adjusted. For example, the x value ranges from 0.25 to 0.75, preferably from 0.4 to 0.6; and the y value ranges from 1.8 to 2.2, preferably from 1.9 to 2.1.

Figure 16A:
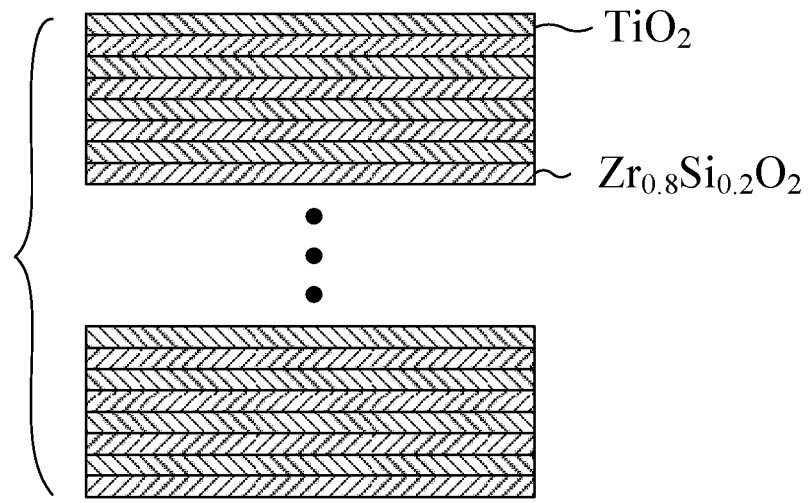
FIG. 16A and FIG. 16B are schematic diagrams illustrating the composition of the ferroelectric layer serving as the dielectric layer of the ferroelectric capacitor according to further embodiments of the present disclosure.
Figure 16B:
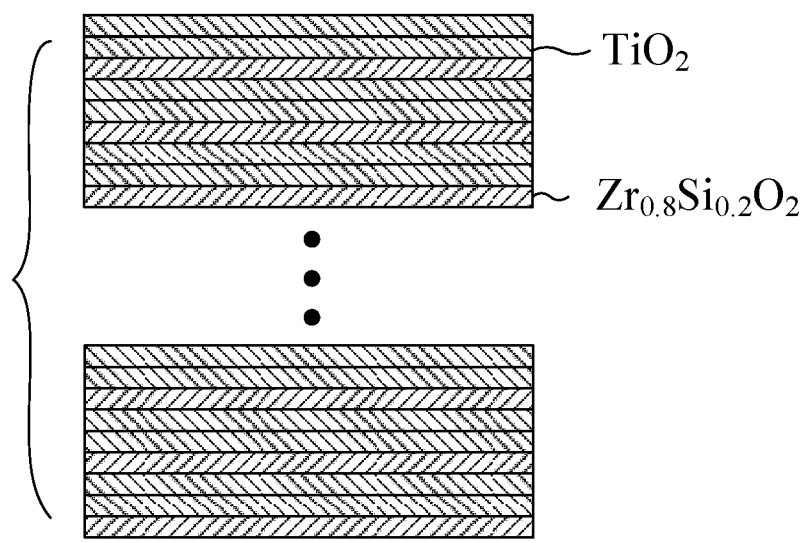

In the embodiment shown in FIG. 16A, the ratio of the number of the $Zr_{0.8}Si_{0.2}O_2$ films to the number of the $TiO_2$ films is 1:1. That is, the $Zr_{0.8}Si_{0.2}O_2$ films and the $TiO_2$ films are alternately deposited. This disclosure does not limit the $Zr_{0.8}Si_{0.2}O_2$ film and the $TiO_2$ film as a top layer and a lower layer or as a lower layer and a top layer in a process cycle. In this embodiment, the x value is 0.5 and the y value is 2, and the doping concentration of Si is 10%. If the ratio of the number of the $Zr_{0.8}Si_{0.2}O_2$ film(s) in each process cycle increases, the x value is greater than 0.5, and the doping concentration of Si is greater than 10%. On the contrary, if the ratio of the number of the TiO$_2$ film(s) in each process cycle increases, the x value is smaller than 0.5, and the doping concentration of Si is smaller than 10%. In the embodiment of FIG. 16B, the ratio of the number of the Zr$_{0.8}$Si$_{0.2}$O$_2$ films to the number of the TiO$_2$ films is 1:2. In that case, the x value is 0.33 and the y value is 2, and the doping concentration of Si is 6.6%. The Si component can adjust or increase the coercive field.

In addition, the ferroelectric layer may be made of a Zr$_{0.9x}$Si$_{0.1x}$Ti$_{(1-x)}$O$_y$ ferroelectric material or a Zr$_{0.95x}$Si$_{0.05x}$Ti$_{(1-x)}$O$_y$ ferroelectric material. The manufacturing method can be modified with reference to FIG. 16A and FIG. 16B, and repetitious details are not given here.

Figure 17:
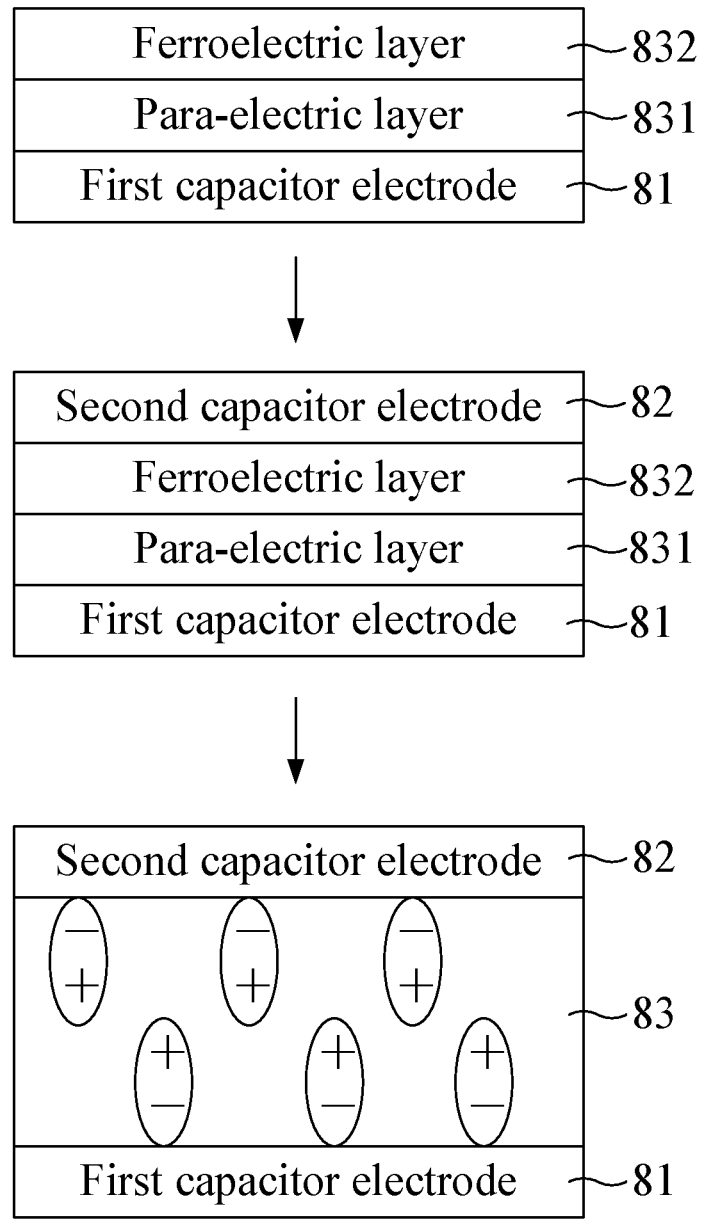
FIG. 17 is a schematic diagram illustrating a manufacturing method of the capacitor structure according to an embodiment of the present disclosure.

The dielectric layer 73 of the capacitor structure 70 (or a parallel-plate capacitor structure) may be made of a para-ferroelectric layer. Please refer to FIG. 17, a schematic diagram illustrating a manufacturing method of the capacitor structure according to an embodiment of the present disclosure, wherein a para-ferroelectric layer is used as the dielectric layer 73. A parallel-plate capacitor is shown in the drawing, but other capacitor structures having different shapes (e.g. the capacitor structure in FIG. 13) are also applicable. At first, a first capacitor electrode 81, a para-electric layer 831, a ferroelectric layer 832 and a second capacitor electrode 82 are piled up and formed sequentially. Then, a rapid thermal annealing process (RTA) is performed to combine and transform the para-electric film 831 and the ferroelectric layer 832 into a para-ferroelectric layer 83. Before forming the second capacitor electrode 82, an annealing process is performed on the first capacitor electrode 81, the para-electric layer 831 and the ferroelectric layer 832 in a high-pressure oxygen (O$_2$) atmosphere. After forming the second capacitor electrode 82, an annealing process is performed on the first capacitor electrode 81, the para-electric layer 831, the ferroelectric layer 832 and the second capacitor electrode 82 in a high-pressure hydrogen (H$_2$)/deuterium (D$_2$) atmosphere. Thus, atoms in the para-electric layer 831 will interdiffuse with atoms in the ferroelectric layer 832, which results in a charge storage structure, to form the para-ferroelectric layer 83.

Specifically, in one embodiment, the step of performing the annealing process in a high-pressure O$_2$ atmosphere is conducted at a temperature of 250° C.~500° C. and in an O$_2$ atmosphere of 5 atm-25 atm, and the annealing process takes 1 hr~3 hr. The step of performing the high-pressure H$_2$/D$_2$ annealing process is conducted at a temperature of 250° C.~500° C. and in an H$_2$/D$_2$ atmosphere of 5 atm~25 atm, and the annealing process takes 1 hr-3 hr.

Figure 18A:
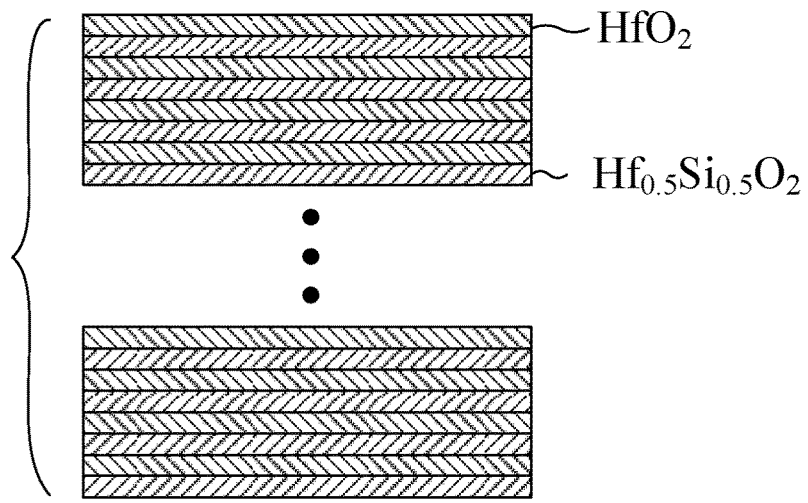
FIG. 18A and FIG. 18B are schematic diagrams illustrating the composition of the para-electric layer in FIG. 17 according to embodiments of the present disclosure.

The para-electric layer 831 may be formed by depositing and piling up Hf$_{0.5}$Si$_{0.5}$O$_2$ films and HfO$_2$ films. First, by ALD, the Hf$_{0.5}$Si$_{0.5}$O$_2$ films containing 50% Si is formed For forming the Hf$_{0.5}$Si$_{0.5}$O$_2$ films, the precursor for donating Hf may be tetrakis(ethylmethylamino)hafnium (TEMAH), tetrakis(dimethylamino) hafnium (TDMAH) or hafnium tetrachloride (HfCl$_4$); the precursor for donating Si may be 4DMAS, 3DMAS, SiCl$_4$ or TEMA-Si; the oxidant may be O$_3$ or H$_2$O; and the deposition temperature (reaction temperature) ranges from 300° C. to 400° C. Then, using ALD to deposit the Hf$_{0.5}$Si$_{0.5}$O$_2$ films and the HfO$_2$ films according to a specific ratio. For forming the HfO$_2$ films, the precursor may be TEMAH, TDMAH or HfCl$_4$; and the deposition temperature (reaction temperature) ranges from 300° C. to 400° C. The number of the Hf$_{0.5}$Si$_{0.5}$O$_2$ film(s) and the HfO$_2$ film(s) in each process cycle is adjusted according to practical requirements. For example, in an embodiment shown in FIG. 18A, the ratio of the number of the Zr$_{0.5}$Si$_{0.5}$O$_2$ films to the number of the HfO$_2$ films is 1:1.

Figure 18B:
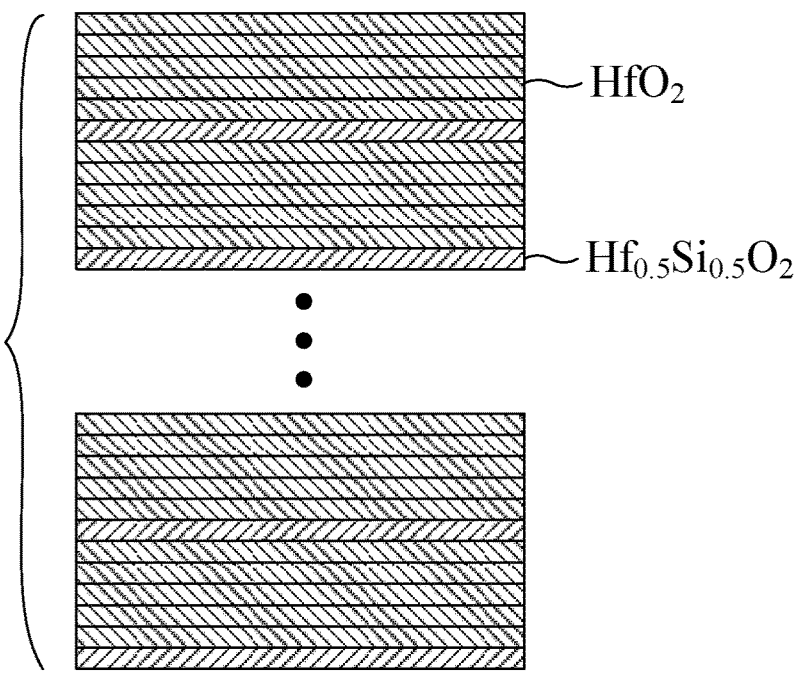

That is, the Zr$_{0.5}$Si$_{0.5}$O$_2$ films and the HfO$_2$ films are alternately deposited. This disclosure does not limit the Zr$_{0.5}$Si$_{0.5}$O$_2$ film and the HfO$_2$ film as a top layer and a lower layer or as a lower layer and a top layer in a process cycle. In the current case, the doping concentration of Si is 25%. In another embodiment shown in FIG. 18B, the ratio of the number of the Zr$_{0.5}$Si$_{0.5}$O$_2$ films to the number of the HfO$_2$ films is 1:5. The doping concentration of Si is 8.3%. The Si component can adjust or increase the coercive field.

Figure 19:
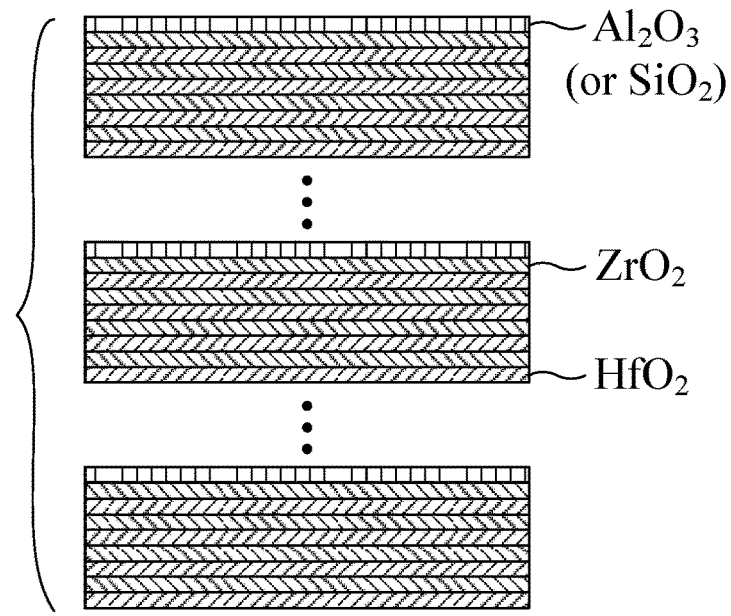
FIG. 19 is a schematic diagram illustrating the composition of the ferroelectric layer in FIG. 17 according to an embodiment of the present disclosure.

FIG. 19, FIG. 20, FIG. 21A and FIG. 21B illustrate different manufacturing methods applicable to the ferroelectric layer 832. Referring to FIG. 19, the ferroelectric layer 832 is made of an Hf$_x$Zr$_{(1-x)}$O$_y$ ferroelectric material doped with Al/Si, wherein the doping concentration ranges from 1% to 15%, preferably from 1% to 5%. The ferroelectric layer 832 is formed by ALD. HfO$_2$ and ZrO$_2$ in the form of single atomic films are grown layer by layer repeatedly or alternately. By controlling the number of the films in each process cycle, the x value and the y value can be adjusted. For example, the x value ranges from 0.25 to 0.75, preferably from 0.4 to 0.6; and the y value ranges from 1.8 to 2.2, preferably from 1.9 to 2.1.

In the embodiment shown in FIG. 19, the ratio of the number of the HfO$_2$ films to the number of the ZrO$_2$ films is 1:1. That is, the HfO$_2$ films and the ZrO$_2$ films are alternately deposited. One HfO$_2$ film and one ZrO$_2$ film constitute a process cycle, but the disclosure does not limit the HfO$_2$ film and the ZrO$_2$ film as a top layer and a lower layer or as a lower layer and a top layer in a process cycle. In this embodiment, the x value is 0.5 and the y value is 2. If the ratio of the number of the HfO$_2$ film(s) in each process cycle increases, the x value is greater than 0.5. On the contrary, if the ratio of the number of the ZrO$_2$ film(s) in each process cycle increases, the x value is smaller than 0.5. After several process cycles, at least one Al$_2$O$_3$ film or at least one SiO$_2$ film may be formed. In this embodiment, one Al$_2$O$_3$ film or one SiO$_2$ film is inserted after every four process cycles. Thus, the doping concentration of Al or Si is about 11%. When the number of cycles for stacking films is larger than ten, the doping concentration of Al or Si is smaller than 5%.

For forming the HfO$_2$ films, the ZrO$_2$ films the Al$_2$O$_3$ films and/or the SiO$_2$ films, the oxidant may be O$_3$ or H$_2$O. The precursor for forming the HfO$_2$ films may be TEMAH, TDMAH or HfCl$_4$, and the deposition temperature (reaction temperature) ranges from 150° C. to 400° C. The precursor for forming the ZrO$_2$ films may be TEMAZ, TDMAZ or ZrCl$_4$, and the deposition temperature (reaction temperature) ranges from 150° C. to 400° C. The precursor for forming the Al$_2$O$_3$ films may be TMA or AlCl$_3$, and the deposition temperature (reaction temperature) ranges from 150° C. to 400° C. The precursor for forming the SiO$_2$ films may be 4DMAS, 3DMAS, SiCl$_4$ or TEMA-Si, and the deposition temperature (reaction temperature) ranges from 150° C. to 400° C.

Figure 20:
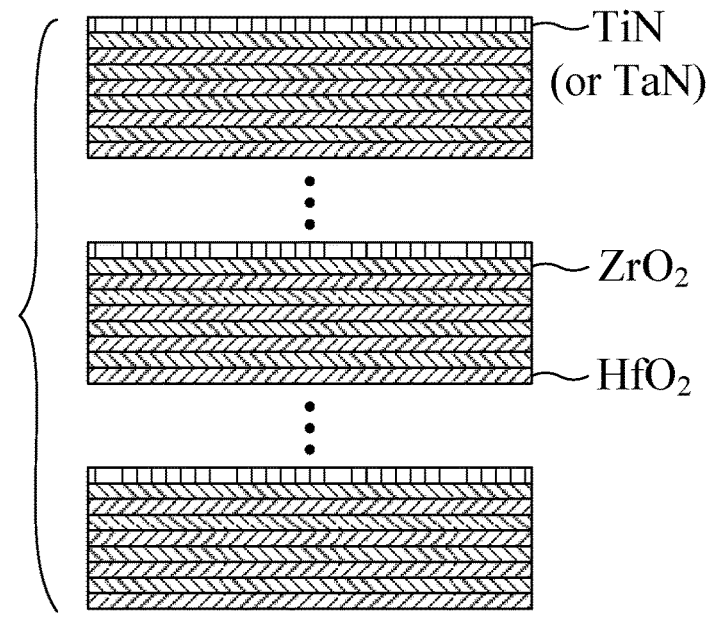
FIG. 20 is a schematic diagram illustrating the composition of the ferroelectric layer in FIG. 17 according to another embodiment of the present disclosure.

The dopants Al or Si in the above embodiments may be replaced by Ti or Ta to adjust or reduce the coercive field. Referring to FIG. 20, the ferroelectric layer 832 is made of, for example, an Hf$_x$Zr$_{(1-x)}$O$_y$ ferroelectric material doped with Ti/Ta, wherein the doping concentration ranges from 1% to 15%, preferably from 1% to 5%. The ferroelectric layer 832 is formed by ALD. HfO$_2$ and ZrO$_2$ in the form of single atomic films are grown layer by layer repeatedly or alternately. By controlling the number of the films in each process cycle, the x value and the y value can be adjusted. For example, the x value ranges from 0.25 to 0.75, preferably from 0.4 to 0.6; and the y value ranges from 1.8 to 2.2, preferably from 1.9 to 2.1.

In the embodiment of FIG. 20, the ratio of the number of the $HfO_2$ films to the number of the $ZrO_2$ films is 1:1. That is, the $HfO_2$ films and the $ZrO_2$ films are alternately deposited. One $HfO_2$ film and one $ZrO_2$ film constitute a process cycle, and the disclosure does not limit the $HfO_2$ film and the $ZrO_2$ film as a top layer and a lower layer or as a lower layer and a top layer in a process cycle. In this embodiment, the x value is 0.5 and the y value is 2. If the ratio of the number of the $HfO_2$ film(s) in each process cycle increases, the x value is greater than 0.5. On the contrary, if the ratio of the number of the $ZrO_2$ film(s) in each process cycle increases, the x value is smaller than 0.5. After several ALD cycles, at least one TiN film or at least one TN film may be formed. In this embodiment, one TiN film or one TN film is inserted after every four process cycles. Thus, the doping concentration of Ti or Ta is about 11%. When the number of cycles for stacking films is larger than ten, the doping concentration of Ti or Ta is smaller than 5%.

For forming the $HfO_2$ films and the $ZrO_2$ films, the oxidant may be $O_3$ or $H_2O$, and the precursors and deposition temperature (reaction temperature) may refer to the above embodiments. For forming the TiN films or the TaN films, the nitrogen donating medium may be $NH_3$, and the precursors and deposition temperature (reaction temperature) may refer to the above embodiments. By this manufacturing method, the ferroelectric layer identically has the advantage of being of stable characteristics.

Besides, the ferroelectric layer 832 may be made of an $Hf_{0.8x}Si_{0.2x}Zr_{(1-x)}O_y$ ferroelectric material. First, by ALD, the $Hf_{0.8}Si_{0.2}O_2$ films containing 20% Si is formed. The precursor for donating Hf may be TEMAH, TDMAH or $HfCl_4$; the precursor for donating Si may be 4DMAS, 3DMAS, $SiCl_4$ or TEMA-Si; the oxidant may be $O_3$ or $H_2O$; and the deposition temperature (reaction temperature) ranges from 300° C. to 400° C. Then, using ALD to deposit $Hf_{0.8}Si_{0.2}O_2$ films and the $ZrO_2$ films according to a specific ratio so as to form $Hf_{0.8x}Si_{0.2x}Zr_{(1-x)}O_y$. The precursor for forming the $ZrO_2$ films may be TEMAZ, TDMAZ or $ZrCl_4$, and the deposition temperature (reaction temperature) ranges from 300° C. to 400° C. By controlling the number of the films in each process cycle, the x value and the y value can be adjusted. For example, the x value ranges from 0.25 to 0.75, preferably from 0.4 to 0.6; and the y value ranges from 1.8 to 2.2, preferably from 1.9 to 2.1.

Figure 21A:
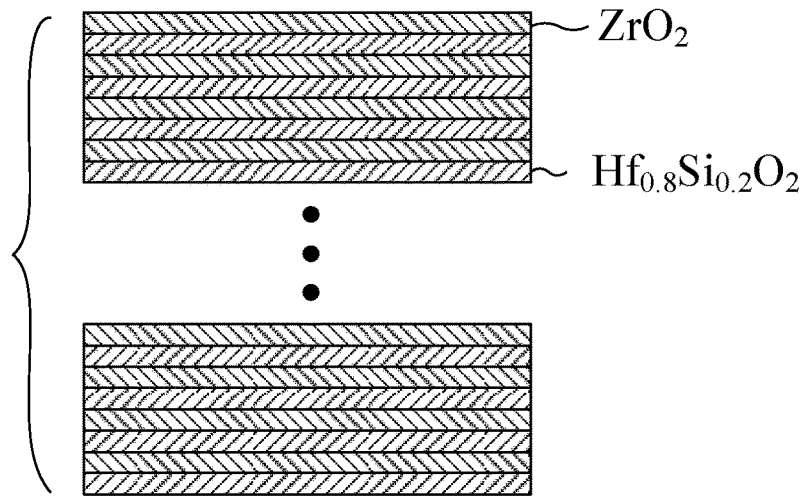
FIG. 21A and FIG. 21B are schematic diagrams illustrating the composition of the ferroelectric layer in FIG. 17 according to further embodiments of the present disclosure.
Figure 21B:
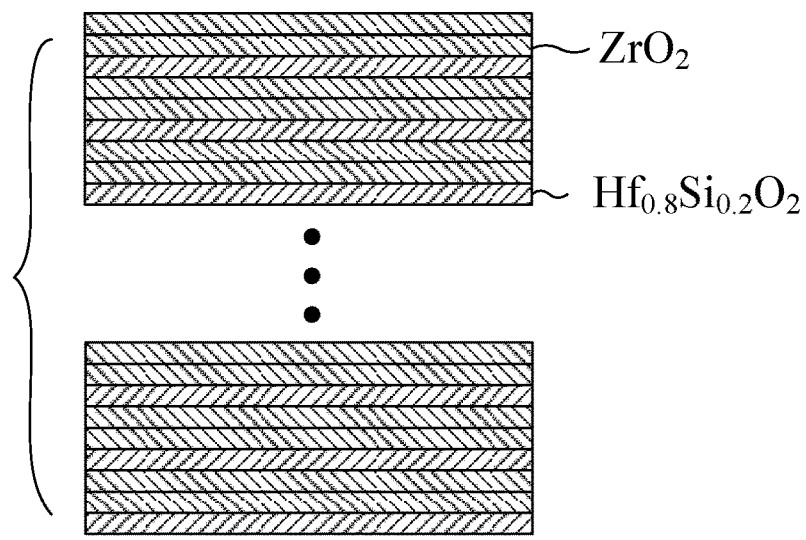

In the embodiment shown in FIG. 21A, the ratio of the number of the $Hf_{0.8}Si_{0.2}O_2$ films to the number of the $ZrO_2$ films is 1:1. That is, the $Hf_{0.8}Si_{0.2}O_2$ films and the $ZrO_2$ films are alternately deposited. One $Hf_{0.8}Si_{0.2}O_2$ film and one $ZrO_2$ film constitute a process cycle, and the disclosure does not limit the $Hf_{0.8}Si_{0.2}O_2$ film and the $ZrO_2$ film as a top layer and a lower layer or as a lower layer and a top layer in a process cycle. In this embodiment, the x value is 0.5 and the y value is 2, and the doping concentration of Si is 10%. If the ratio of the number of the $Hf_{0.8}Si_{0.2}O_2$ film(s) in each process cycle increases, the x value is greater than 0.5, and the doping concentration of Si is greater than 10%. On the contrary, if the ratio of the number of the $ZrO_2$ film(s) in each process cycle increases, the x value is smaller than 0.5, and the doping concentration of Si is smaller than 10%. In the embodiment of FIG. 21B, the ratio of the number of the $Hf_{0.8}Si_{0.2}O_2$ films to the number of the $ZrO_2$ films is 1:2. In this embodiment, the x value is 0.33 and the y value is 2, and the doping concentration of Si is 6.6%. The Si component can adjust or increase the coercive field.

In addition, the ferroelectric layer 832 may be made of an $Hf_{0.9x}Si_{0.1x}Zr_{(1-x)}O_y$ ferroelectric material or an $Hf_{0.95x}Si_{0.05x}Zr_{(1-x)}O_y$ ferroelectric material. The manufacturing method can be known from the description with reference to FIG. 21A and FIG. 21B, and repetitious details are not given here.

In summary, the present disclosure provides a ferroelectric memory which may not use FeFETs as switches, so the ferroelectric memory is less affected by operational voltages. The present disclosure further provides the data writing method, the data reading method, the manufacturing method of the ferroelectric memory, the structure of the ferroelectric capacitor and the manufacturing method of ferroelectric capacitor, for supporting manufacturing and operation of the ferroelectric memory, so as to have the techniques provided in the disclosure become practically applicable solutions.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A data reading method of a ferroelectric memory, suitable for accessing data stored in the ferroelectric memory, the ferroelectric memory comprising at least one ferroelectric memory cell, the ferroelectric memory cell comprising a first field effect transistor and a ferroelectric capacitor, the first field effect transistor comprising a control terminal, a first access terminal and a second access terminal, the ferroelectric capacitor comprising a first capacitor electrode and a second capacitor electrode, the control terminal, the first access terminal and the second access terminal of the first field effect transistor being respectively electrically connected to a first word line, a first bit line and the first capacitor electrode of the ferroelectric capacitor, the second capacitor electrode of the ferroelectric capacitor being electrically connected to a plate line, the data reading method comprising steps of:

provide a first signal to the plate line, a voltage level of the first signal during a first time period being different from the voltage level of the first signal outside the first time period;

providing a second signal to the first word line, a voltage level of the second signal during a second time period being different from the voltage level of the second signal outside the second time period;

obtaining a first data signal from the first bit line during the second time period;

writing corresponding data into the ferroelectric memory cell during the first time period according to a relation between a voltage level of the first data signal and a reference level; and outputting data stored in the ferroelectric memory cell according to the relation between the voltage level of the first data signal and the reference level;

wherein the first time period entirely covers the second time period, and the voltage level of the first signal is constant during the first time period.

2. The data reading method according to claim 1, further comprising a step of adjusting a voltage level of the first bit line to a default voltage level at the same time as or after the end of the second time period.

3. The data reading method according to claim 2, wherein the step of writing the corresponding data into the ferroelectric memory cell further comprises steps of:

biasing the first bit line with a first data write level while first data is written into the ferroelectric memory cell during the second time period; and biasing the first bit line with a second data write level while second data is written into the ferroelectric memory cell during the second time period, wherein the default voltage level falls between the first data write level and the second data write level, and the default voltage level equals neither the first data write level nor the second data write level.

4. The data reading method according to claim 1, wherein the ferroelectric memory cell further comprises a second field effect transistor comprising a control terminal, a first access terminal and a second access terminal, the control terminal, the first access terminal and the second access terminal of the second field effect transistor being respectively electrically connected to a second word line, a second bit line, and the first capacitor electrode of the ferroelectric capacitor, and the data reading method further comprises a step of providing a third signal to the second word line, a voltage level of the third signal during a third time period being different from the voltage level of the third signal outside the third time period, wherein the first time period entirely covers the third time period, and the step of writing the corresponding data into the ferroelectric memory cell is performed during the third time period.

5. The data reading method according to claim 4, wherein the step of writing the corresponding data into the ferroelectric memory cell during the first time period further comprises steps of:

biasing the second bit line with a first data write level while the first data is written into the ferroelectric memory cell during the third time period; and biasing the second bit line with a second data write level while the second data is written into the ferroelectric memory cell during the third time period.

6. A data writing method of a ferroelectric memory, suitable for accessing data stored in the ferroelectric memory, the ferroelectric memory comprising at least one ferroelectric memory cell, the ferroelectric memory cell comprising a first field effect transistor and a ferroelectric capacitor, the first field effect transistor comprising a control terminal, a first access terminal and a second access terminal, the ferroelectric capacitor comprising a first capacitor electrode and a second capacitor electrode, the control terminal, the first access terminal and the second access terminal of the first field effect transistor being respectively electrically connected to a word line, a first bit line and the first capacitor electrode of the ferroelectric capacitor, the second capacitor electrode of the ferroelectric capacitor being electrically connected to a plate line, the data writing method comprising steps of:

providing a first signal to the plate line, a voltage level of the first signal during a first time period being different from the voltage level of the first signal outside the first time period;

providing a second signal to the word line, a voltage level of the second signal during a second time period being different from the voltage level of the second signal outside the second time period; and providing a write signal to the first bit line during the second time period, the write signal corresponding to the data which is to be written into the ferroelectric memory cell, wherein the first time period entirely covers the second time period, and the voltage level of the first signal is constant during the first time period.

7. The data writing method according to claim 6, further comprising a step of adjusting a voltage level of the first bit line to a default voltage level before the end of the second time period.

8. The data writing method according to claim 7, wherein the step of providing the write signal to the first bit line during the second time period further comprising steps of:

setting the write signal to have a first data write level while first data is written into the ferroelectric memory cell during the second time period; and setting the write signal to have a second data write level while second data is written into the ferroelectric memory cell during the second time period, wherein the default voltage level falls between the first data write level and the second data write level, and the default voltage level equals neither the first data write level nor the second data write level.

* * * * *